(12) United States Patent
Fuse et al.

(10) Patent No.: US 9,389,255 B2
(45) Date of Patent: Jul. 12, 2016

(54) MILLIMETER-WAVE BAND SPECTRUM ANALYSIS DEVICE AND ANALYSIS METHOD

(71) Applicant: ANRITSU CORPORATION, Kanagawa (JP)

(72) Inventors: Masaaki Fuse, Kanagawa (JP); Akihito Otani, Kanagawa (JP); Hitoshi Sekiya, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 301 days.

(21) Appl. No.: 14/212,393

(22) Filed: Mar. 14, 2014

(65) Prior Publication Data

US 2014/0292305 A1    Oct. 2, 2014

(30) Foreign Application Priority Data

Mar. 28, 2013  (JP) .................................. 2013-069529

(51) Int. Cl.
*G01R 23/165* (2006.01)
*G01R 23/16* (2006.01)
*G01R 23/173* (2006.01)

(52) U.S. Cl.
CPC .............. *G01R 23/165* (2013.01); *G01R 23/16* (2013.01); *G01R 23/173* (2013.01)

(58) Field of Classification Search
CPC .... G01R 23/165; G01R 23/16; G01R 23/173; G01R 23/163; G01R 27/28; G01R 25/00
See application file for complete search history.

(56) References Cited

U.S. PATENT DOCUMENTS

| | | | | |
|---|---|---|---|---|
| 5,231,073 A * | 7/1993 | Cohn | ..................... | H01J 23/20 264/322 |
| 5,736,845 A | 4/1998 | Kosuge | | |
| 6,112,067 A * | 8/2000 | Seike | ..................... | H04B 17/23 455/226.4 |
| 6,674,969 B1 * | 1/2004 | Ogusu | ..................... | H04J 14/02 398/79 |
| 7,746,052 B2 | 6/2010 | Noujeim | | |
| 2012/0243823 A1 * | 9/2012 | Giboney | ................. | H01P 1/162 385/14 |

* cited by examiner

*Primary Examiner* — Patrick Assouad
*Assistant Examiner* — Haidong Zhang
(74) *Attorney, Agent, or Firm* — Pearne & Gordon LLP

(57) ABSTRACT

An input signal Sx in a first millimeter-wave frequency band higher than 100 GHz is input to a millimeter-wave band filter 20 in which a pair of radio wave half mirrors 30A and 30B so as to opposite to each other and which performs a resonance operation. A signal component Sa corresponding to the resonance frequency of the filter is extracted, is mixed with a first local signal L1 with a fixed frequency, and is converted into a signal in a second frequency band. The converted signal component Sb is mixed with a second local signal L2 whose frequency is swept and is converted into a signal in a predetermined intermediate frequency band. Then, the level of the signal is detected. The millimeter-wave filter 20 has high selectivity characteristics in a frequency domain higher than 100 GHz and can change its passband center frequency.

5 Claims, 22 Drawing Sheets

| | No gap | Gap is 20μm and groove is provided | Gap is 20μm and no groove is provided |
|---|---|---|---|
| Center frequency (GHz) | 133.523 | 133.118 | 133.243 |
| Insertion loss (dB) | 2.34 | 3.67 | 19.19 |
| 3dB bandwidth (GHz) | 0.280 | 0.343 | 0.964 |
| Q | 477 | 388 | 138 |

MILLIMETER-WAVE BAND SPECTRUM ANALYSIS DEVICE AND ANALYSIS METHOD

TECHNICAL FIELD

The present invention relates to a technique for analyzing the spectrum of a signal in a millimeter-wave band with high accuracy.

BACKGROUND ART

In general, a spectrum analyzer which analyzes the spectrum of a signal in a wide band continuously sweeps the local frequency of a heterodyne front end to convert each frequency component in an input signal into a frequency component in an intermediate frequency band and detects the level of the signal.

In recent years, with the development of the information society, the amount of information used in various types of communication has increased. Therefore, frequency resources in the microwave band which has been used are insufficient.

Therefore, various types of applications have changed to a high frequency domain and an analysis frequency required for a measurement device (spectrum analysis device) which is used to evaluate the applications has changed from a microwave band to a millimeter-wave band.

In a spectrum analysis device (spectrum analyzer) which is obtainable on the market, a YIG tuned filter (YTF) is used in the front end in order to avoid a measurement error caused by an image signal. The upper limit of the operating frequency of the YTF is about 60 GHz and the YTF is not used to analyze a frequency higher than the upper limit.

When a signal with a frequency (higher than 100 GHz) higher than the upper limit frequency (for example, 60 GHz) which can be measured by a single spectrum analyzer is analyzed, a mixer which is provided outside the spectrum analyzer is generally used to measure the frequency. In general, a harmonic mixer is mainly used as the mixer.

For example, the following Patent Documents 1 and 2 disclose a frequency conversion technique for measuring the frequency higher than the upper limit of the operating frequency of the YTF.

RELATED ART DOCUMENT

Patent Document

[Patent Document 1] U.S. Pat. No. 7,746,052
[Patent Document 2] U.S. Pat. No. 5,736,845

DISCLOSURE OF THE INVENTION

Problem that the Invention is to Solve

In a harmonic mixing method using the harmonic mixer, as shown in FIG. 26, an oscillator 1 generates a signal La in a frequency band of, for example, 40 GHz and inputs the signal into a harmonic generator 2. The harmonic generator 2 generates harmonics Lh2, Lh3, . . . in a frequency band that is an integer multiple of 40 GHz, that is, a frequency band of 80 GHz, a frequency band of 120 GHz, a frequency band of 160 GHz, . . . and inputs the harmonics to a mixer 3. The mixer 3 converts an input signal Sin into a signal Sif in an intermediate frequency band with the number of harmonics LhN of a desired order (Lh1 is a fundamental wave with a frequency of 40 GHz).

However, in the spectrum analyzer in which the harmonic mixing method is applied to the front end, frequency-converted components of many harmonic components other than the local signal of a desired order and signal components (including a noise component) included in the input signal overlap each other on the output side of the mixer 3. As a result, the level of a noise floor increases and it is difficult to recognize the spectrum of a low-level signal.

Even when the spectrum of the input signal in which a frequency band including a signal component is unknown is observed, there are heterodyne components (an image component or second-order and three-order intermodulation components) between harmonics of many orders and it is difficult to accurately perform observation.

For these reasons, the accuracy of spectrum analysis for a band higher than 100 GHz in the millimeter-wave band is insufficient.

The invention has been made in order to solve the above-mentioned problems and an object of the invention is to provide a millimeter-wave band spectrum analysis device and a millimeter-wave band spectrum analysis method capable of performing spectrum analysis in a millimeter-wave band higher than 100 GHz.

Means for Solving the Problem

In order to achieve the object, according to a first aspect of the invention, a millimeter-wave band spectrum analysis device includes: a millimeter-wave band filter (20 to 20", 220) that includes a transmission line (21, 222, 223) which is formed by a waveguide (22 to 27, 221, 221A, 221B) that propagates electromagnetic waves in a first millimeter-wave frequency band from one end to the other end in a TE10 mode, a pair of planar radio wave half mirrors (30A, 30B, 240A, 240B) which are arranged so as to be opposite to each other with a distance therebetween while blocking the inside of the transmission line, transmit some of the electromagnetic waves in the first frequency band, and reflect some of the electromagnetic waves, and resonance frequency change means (40, 52, 250) for changing an electrical length between the pair of radio wave half mirrors to change a resonance frequency of a resonator formed between the pair of radio wave half mirrors in the first frequency band, extracts a signal component in a band having the resonance frequency as a passband center frequency from a signal which is input from one end of the transmission line, and outputs the signal component from the other end; a frequency conversion unit (100) that mixes the output signal from the millimeter-wave band filter with a first local signal with a fixed frequency to convert the output signal into a signal in a second frequency band lower than the first frequency band; a spectrum detection unit (110) that converts each frequency component of the signal in the second frequency band which is converted by the frequency conversion unit into each frequency component in a predetermined intermediate frequency band using a second local signal whose frequency can be swept and detects the level of each frequency component; and a control unit (120) that stores data which associates the resonance frequency with the electrical length between the pair of radio wave half mirrors of the millimeter-wave band filter in advance, changes the passband center frequency of the millimeter-wave band filter so as to cover an observation frequency range on the basis of the data when frequency resolution and a desired observation frequency range of the first frequency band are designated, controls the sweep of the frequency of the second local signal of the spectrum detection unit, and detects a spectrum waveform of a signal in the observation frequency range with the frequency resolution.

According to a second aspect of the invention, in the millimeter-wave band spectrum analysis device according to the first aspect, the control unit may have a first control mode which operatively associates a change in the passband center frequency of the millimeter-wave band filter with the sweep of the second local signal of the spectrum detection unit and a second control mode which sweeps the second local signal of the spectrum detection unit in a change step smaller than a change step of the passband center frequency of the millimeter-wave band filter and select any one of the first control mode and second control mode on the basis of the designated observation frequency range and frequency resolution.

According to a third aspect of the invention, in the millimeter-wave band spectrum analysis device according to the first aspect, the resonance frequency change means of the millimeter-wave band filter may have a structure in which the distance between the pair of radio wave half mirrors is changed by a driving device having a stepping motor as a driving source, and the control unit may use a state in which the distance between the pair of radio wave half mirrors is equal to a predetermined value as a reference state and change the passband center frequency of the millimeter-wave band filter on the basis of data which associates the resonance frequency with the number of driving pulses of the stepping motor.

According to a fourth aspect of the invention, in the millimeter-wave band spectrum analysis device according to the second aspect, the resonance frequency change means of the millimeter-wave band filter may have a structure in which the distance between the pair of radio wave half mirrors is changed by a driving device having a stepping motor as a driving source, and the control unit may use a state in which the distance between the pair of radio wave half mirrors is equal to a predetermined value as a reference state and change the passband center frequency of the millimeter-wave band filter on the basis of data which associates the resonance frequency with the number of driving pulses of the stepping motor.

According to a fifth aspect of the invention, a millimeter-wave band spectrum analysis method includes: a step of extracting a signal component in a band having a resonance frequency as a passband center frequency from a signal which is input from one end of a transmission line (21, 222, 223) using a millimeter-wave band filter (20 to 20", 220) that includes the transmission line formed by a waveguide (22 to 27, 221, 221A, 221B) which propagates electromagnetic waves in a first millimeter-wave frequency band from one end to the other end in a TE10 mode, a pair of planar radio wave half mirrors (30A, 30B, 240A, 240B) which are arranged so as to be opposite to each other with a distance therebetween while blocking the inside of the transmission line, transmit some of the electromagnetic waves in the first frequency band, and reflect some of the electromagnetic waves, and resonance frequency change means (40, 52, 250) for changing an electrical length between the pair of radio wave half mirrors to change a resonance frequency of a resonator formed between the pair of radio wave half mirrors in the first frequency band; a step of mixing the output signal from the millimeter-wave band filter with a first local signal with a fixed frequency to convert the output signal into a signal in a second frequency band lower than the first frequency band; a step of converting each frequency component of the signal in the second frequency band which is converted by the frequency conversion unit into each frequency component in a predetermined intermediate frequency band using a second local signal whose frequency can be swept and detecting the level of each frequency component; and a step of storing data which associates the resonance frequency with the electrical length between the pair of radio wave half mirrors of the millimeter-wave band filter in advance, changing the passband center frequency of the millimeter-wave band filter so as to cover an observation frequency range on the basis of the data when frequency resolution and a desired observation frequency range of the first frequency band are designated, controlling the sweep of the frequency of the second local signal, and detecting a spectrum waveform of a signal in the observation frequency range with the frequency resolution.

Advantage of the Invention

As such, in the invention, among the signal components included in the first frequency band of the millimeter-wave band, only the signal component selected by the millimeter-wave band filter in which a pair of radio wave half mirrors are arranged in the transmission line so as to be opposite to each other and which performs a resonance operation is mixed with the first local signal with a fixed frequency and is converted into a signal in the second frequency band. The converted signal component is mixed with the second local signal whose frequency is swept and is converted into a signal in a predetermined intermediate frequency band. Then, the level of the signal is detected.

The millimeter-wave filter having the above-mentioned structure has high selectivity characteristics in the frequency domain higher than 100 GHz and can change the electrical length between the radio wave half mirrors to change its passband center frequency.

Therefore, in the initial mixing process, the signal component in the narrow band which is selected by the millimeter-wave band filter is mixed with the first local signal with a single frequency and is converted into a signal in the second frequency band. The frequency-converted signal is obtained from the input signal. Therefore, it is possible to obtain a signal which is not from other mixing modes (an image response or a response to an unnecessary harmonic signal).

Therefore, spurious components are less likely to occur even in a signal with an unknown spectrum distribution due to, for example, an image or intermodulation. As a result, accurate spectrum analysis is performed in the millimeter-wave band higher than 100 GHz.

In addition, it is possible to prevent a mixture of a high-level signal and a low-level signal from being input to the mixer. Therefore, it is possible to prevent the harmonic distortion of an input signal caused by the mixer and improve the dynamic range.

BEST MODE FOR CARRYING OUT THE INVENTION

Hereinafter, embodiments of the invention will be described with reference to the drawings.

Figure 1:
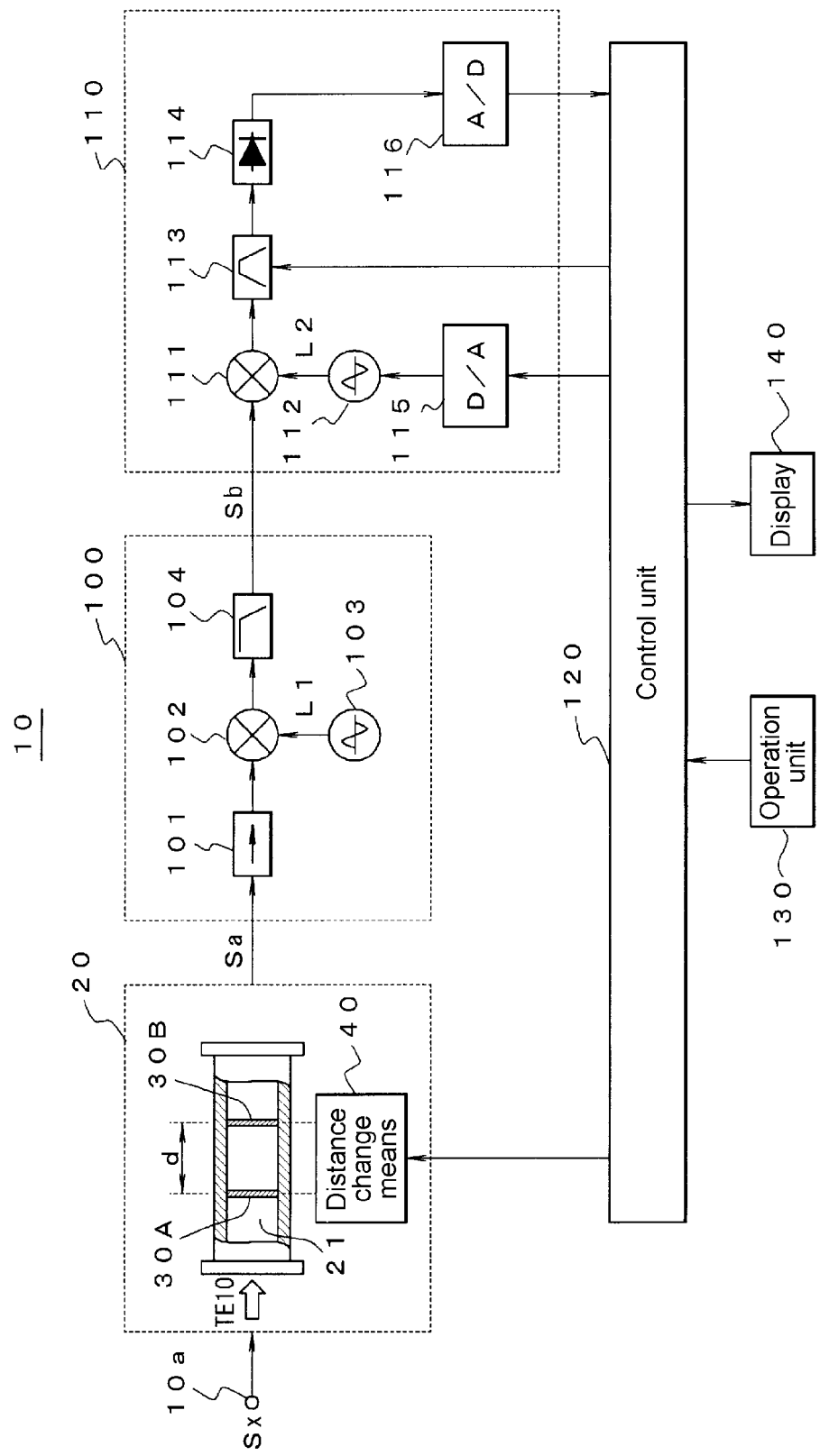
FIG. 1 is a diagram illustrating the structure of an embodiment of the invention.

FIG. 1 shows the structure of a millimeter-wave band spectrum analysis device 10 according to the invention.

The millimeter-wave band spectrum analysis device 10 includes a millimeter-wave band filter 20, a frequency conversion unit 100, a spectrum detection unit 110, a control unit 120, an operation unit 130, and a display 140.

In the millimeter-wave band filter 20, radio wave half mirrors 30A and 30B which are opposite to each other so as to block a waveguide-tube-type transmission line 21 are provided in the transmission line 21 with a size (for example, a standard size of 2.032 mm×1.016 mm) capable of propagating an electromagnetic wave in a millimeter-wave band of 110 GHz to 140 GHz in a TE10 mode to form a resonator whose resonance frequency (=the speed of light/2d) is determined by a distance d (corresponding to half the guide wavelength λg) between the radio wave half mirrors 30A and 30B. A signal Sin in the millimeter-wave band which is input from an input terminal 10a is input to one end of the transmission line and is propagated to the other end. A signal component in a predetermined passband Fw having, as a center, a passband center frequency Fc that is equal to the resonance frequency of the resonator formed by a pair of the radio wave half mirrors 30A and 30B which are opposite to each other with the distance d therebetween is extracted and is then output from the other end. For example, when the distance d is 1.5 mm and the speed of light is 3×10$^8$ m, the resonance frequency is approximately as follows:

$$3\times10^8/(3\times10^{-3})=10^{11} \text{ Hz}=100 \text{ GHz}.$$

The millimeter-wave band filter 20 has a distance change mechanism (slide mechanism) which changes the distance d between the radio wave half mirrors in a range of, for example, 1.4 mm to 0.9 mm and a driving source (for example, a stepping motor) of the change mechanism is driven by a control signal to change the passband center frequency Fc in a first frequency band (for example, 110 GHz to 140 GHz). The detailed structure of the millimeter-wave band filter 20 will be described below.

An output signal Sa from the millimeter-wave band filter 20 is input to the frequency conversion unit 100. The frequency conversion unit 100 mixes the output signal Sa from the millimeter-wave band filter 20 with a first local signal L1 with a fixed frequency to convert the output signal Sa into a signal in a second frequency band lower than the first frequency band and includes an isolator 101, a mixer 102, a local signal generator 103, and a low-pass filter 104.

The isolator 101 inputs the signal Sa to the mixer 102 and suppresses a reflection component from the mixer 102 to the millimeter-wave band filter 20 to prevent an adverse effect on the resonance operation of the millimeter-wave band filter 20.

The local signal generator 103 outputs a first local signal L1 with a fixed frequency (for example, 105 GHz). For example, a multiplier multiplies an output of 15 GHz from a fixed oscillator by 7 to generate the first local signal L1 with a frequency higher than 100 GHz. In the multiplication process, since the frequency is fixed, it is possible to remove harmonics of an unnecessary order using a fixed narrowband filter. As the fixed filter, a filter can be used in which the distance between the radio wave half mirrors in the millimeter-wave band filter 20 (or each millimeter-wave band filter described below) is fixed to a value at which the resonance frequency is 105 GHz. Since the passband width of the millimeter-wave band filter is several hundreds of megahertz, it is possible to almost completely separate harmonics of an unnecessary order and harmonics of a desired order which are 10 GHz or more away from each other. Therefore, there is no concern that unnecessary harmonics will be given to the mixer 102.

The mixer 102 mixes the signal Sa in the first frequency band (110 GHz to 140 GHz) with the first local signal L1 (105 GHz) and outputs frequency components corresponding to a difference from the sum of the signals. Among the frequency components, the low-pass filter 104 extracts a frequency component (5 GHz to 35 GHz) corresponding to the difference in the second frequency band. When the characteristics of the mixer 102 do not respond to the band of sum components (215 GHz or more), the low-pass filter 104 may be omitted or the frequency components (5 GHz to 35 GHz) corresponding to the difference in the second frequency band may be output.

The signal Sb in the second frequency band which has been converted by the frequency conversion unit 100 is input to the spectrum detection unit 110. The spectrum detection unit 110 converts each frequency component included in the signal Sb into a frequency component in a predetermined intermediate frequency band Fif using a frequency-swept second local signal L2 and detects the level of each frequency component.

The spectrum detection unit 110 may have any structure as long as it can detect the spectrum of a signal in the second frequency band (for example, 5 GHz to GHz) with high accuracy. The existing spectrum analyzer which can analyze the spectrum of a signal in the band may be used.

As the simplest example, it is assumed that the spectrum detection unit 110 includes a mixer 111, a local signal generator 112, an intermediate frequency filter 113, a level detector 114, a D/A converter 115, and an A/D converter 116.

The mixer 111 mixes the signal Sb in the second frequency band with a second local signal L2 output from the local signal generator 112 and outputs frequency components which are the difference from the sum of the signals. When the intermediate frequency band is 4 GHz and the frequency sweep range of the second local signal L2 is from 9 GHz to 39 GHz, the intermediate frequency filter 113 with a center frequency of 4 GHz may extract the frequency components corresponding to the difference in the output from the mixer 111. In practice, it is necessary to convert the signal with a center frequency of 4 GHz into a signal in a lower intermediate frequency band (several megahertz to several tens of megahertz) using a local signal with a fixed frequency and to increase frequency resolution using a narrowband filter. However, in this embodiment, the simplest structure is considered.

The level detector 114 detects the converted signal in the intermediate frequency band, converts the level of the signal into a voltage, and outputs the voltage to the A/D converter 116.

The local signal generator 112 uses a YTO which uses YIG as a resonator as an oscillation source and drives the YTO with a current which is proportional to the voltage of a sweep control signal input from the D/A converter 115 to sweep the frequency of the second local signal L2.

The control unit 120 performs, for example, variable control for the passband center frequency of the millimeter-wave band filter 20, sweep control for the local signal from the spectrum detection unit 110, and control for the bandwidth (frequency resolution) of the intermediate frequency band on the basis of an observation frequency range or frequency resolution which is set by the user through the operation unit 130 to acquire data for a spectrum waveform in the observation frequency range and displays the waveform data on the display 140.

As described above, the distance d between the pair of radio wave half mirrors in the transmission line is mechanically changed to change the passband center frequency of the millimeter-wave band filter 20. However, in order to control the distance d with high reproducibility, a stepping motor which is accurately driven by digital data needs to be used as the driving source and the relationship between the distance between the radio wave half mirrors which is changed by the stepping motor and the passband center frequency of the millimeter-wave band filter 20 needs to be calculated in advance.

Figure 2:
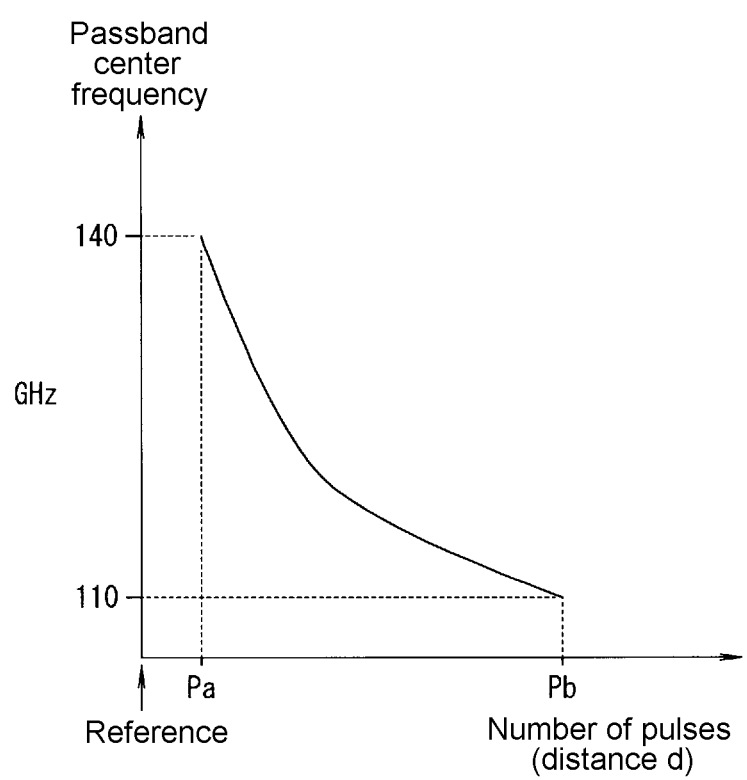
FIG. 2 is a diagram illustrating the relationship between the number of driving pulses and a passband center frequency of a millimeter-wave band filter.

For example, a state in which the distance d between the radio wave half mirrors that is determined by mechanistic limitation is the maximum or minimum is referred to as a reference state. In addition, as shown in FIG. 2, the relationship between the number of pulses applied to the stepping motor, which is the driving source, in the reference state and the passband center frequency is calculated in advance and is stored in the internal memory. The distance d between the radio wave half mirrors is proportional to a resonance wavelength. Therefore, when a mechanism in which the distance d is proportional to the number of pulses is used, the passband center frequency of the filter is inversely proportional to the number of pulses. That is, the relationship between the passband center frequency and the distance d changes non-linearly.

In the filter with the structure in which the distance between the mirrors is mechanically changed as described above, the distance which can be changed in the minimum step of the control signal is determined by mechanical limitation and it is difficult to change the distance in minute steps corresponding to the frequency resolution (for example, several hundreds of hertz) of the spectrum detection unit 110. It is practical to change a bandwidth of 30 GHz in, for example, 3000 steps (an average of 10 MHz per step). However, the conditions are that the passband width of the filter is more than a step change width of 10 MHz (for example, ±100 MHz).

Figure 3:
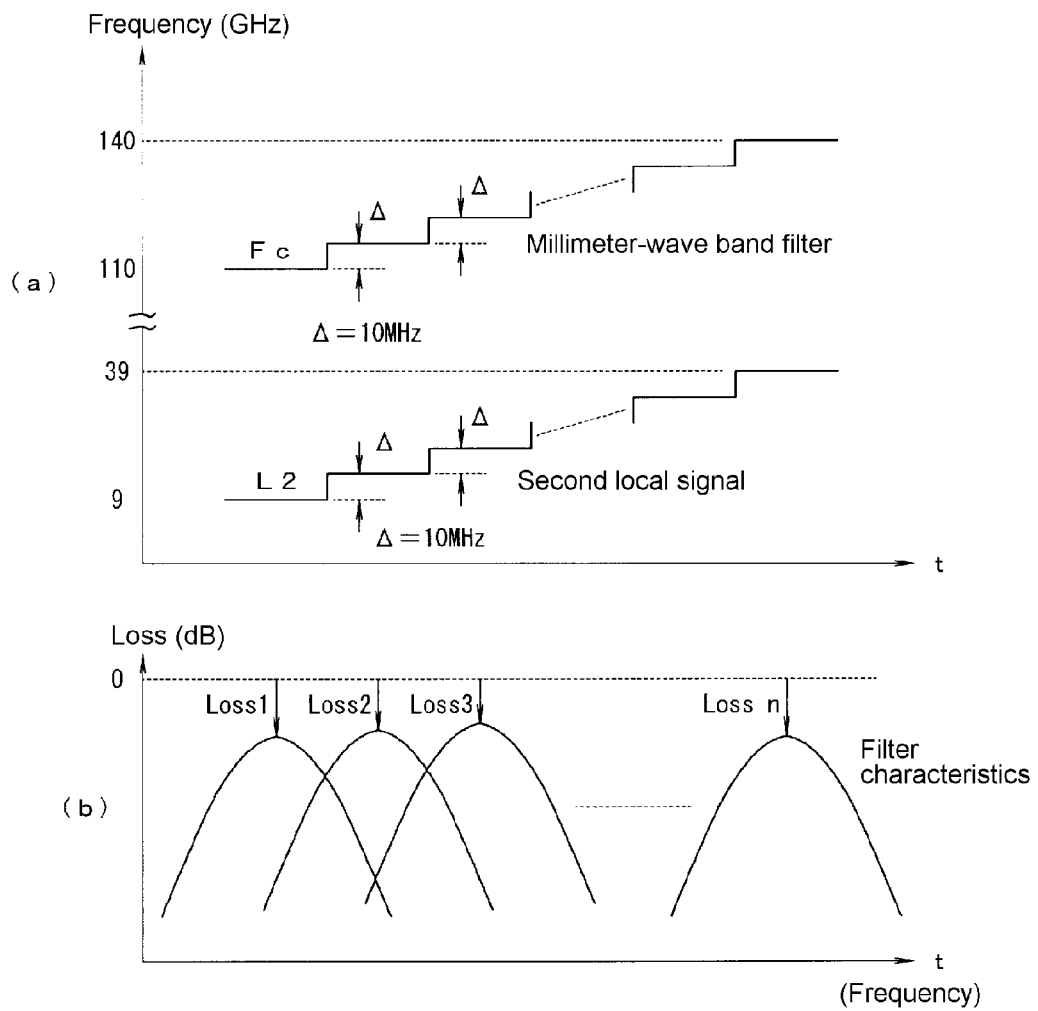
FIG. 3 is a diagram illustrating an example (first control mode) of variable control for the passband center frequency of the millimeter-wave band filter and a frequency of a second local signal.

Therefore, for example, when spectrum analysis is roughly performed in the entire range of 110 GHz to 140 GHz in a step of 10 MHz, as shown in FIG. 3, the frequency FL2 of the second local signal of the spectrum detection unit 110 may be swept from 9.0 GHz to 39.0 GHz in a step of 10 MHz and the passband center frequency Fc of the millimeter-wave band filter 20 may be changed from 110.0 GHz to 140.0 GHz in a step of 10 MHz in operative association with the sweep of the local frequency. As such, the mode which follows the passband center frequency of the millimeter-wave band filter 20 in steps that are substantially equal to the sweep step (this value corresponds to frequency resolution) of the local signal of the spectrum detection unit 110 is referred to as a first control mode.

Figure 4:
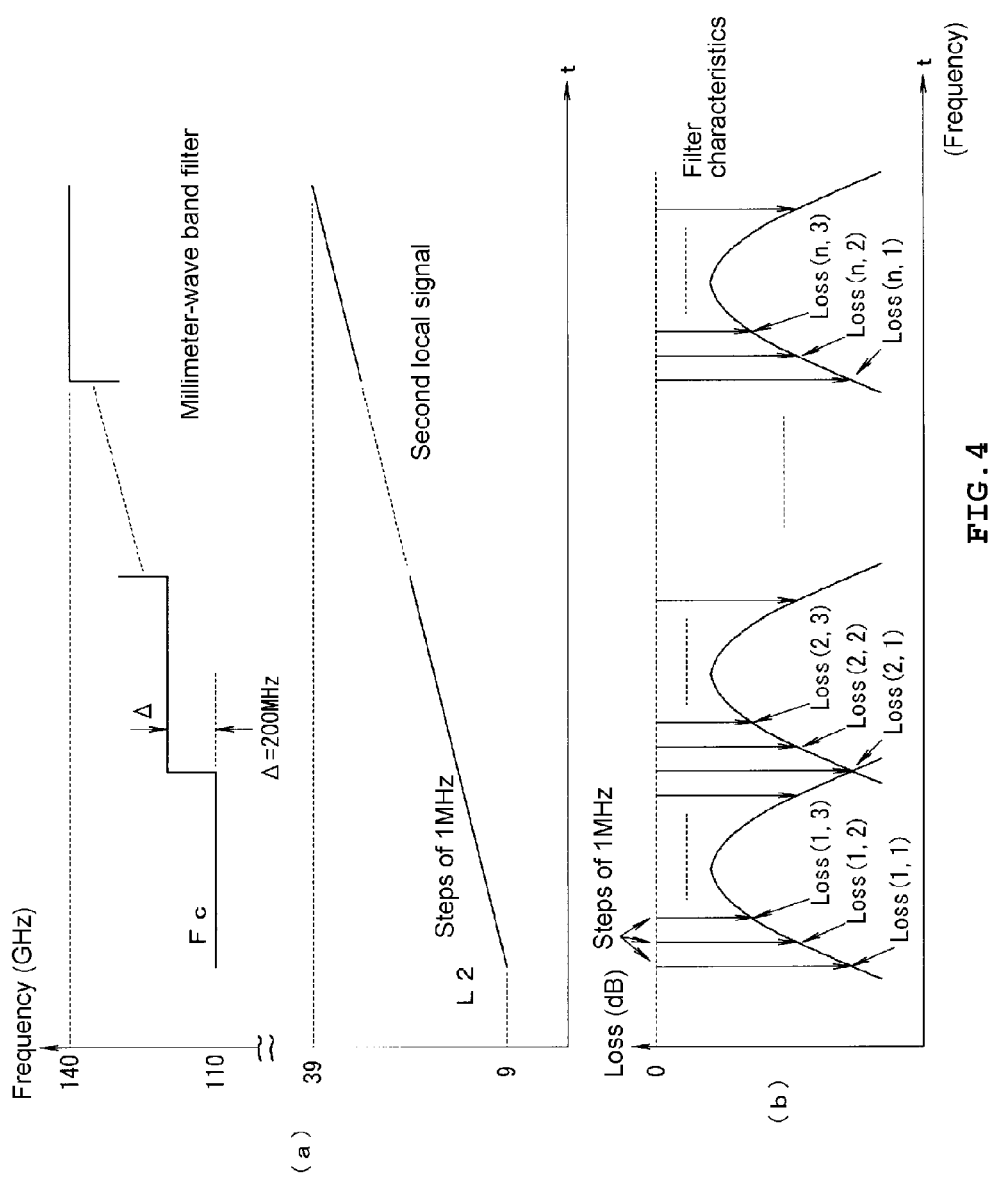
FIG. 4 is a diagram illustrating an example (second control mode) of variable control for the passband center frequency of the millimeter-wave band filter and the frequency of the second local signal.

On the contrary, for example, when spectrum analysis is finely performed in the entire range of 110 GHz to 140 GHz in a step of 1 MHz, as shown in FIG. 4, the following process is repeated 150 times to acquire a spectrum in the entire range of 110 GHz to 140 GHz: the frequency FL2, 200 MHz, of the second local signal of the spectrum detection unit 110 is swept from 9.0 GHz to 9.2 GHz in a step of 1 MHz, with the passband center frequency Fc of the millimeter-wave band filter 20 being fixed to 110.1 GHz close to the lower limit (a passband of 110.0 GHz to 110.2 GHz); the spectrum of a signal with a frequency bandwidth of 200 MHz which has passed through the millimeter-wave band filter 20 is acquired; and the passband center frequency Fc of the millimeter-wave band filter 20 is increased by 200 MHz. As such, a mode in which a process that detects a spectrum component in the passband width (or less) of the millimeter-wave band filter 20 using the sweep of the local signal of the spectrum detection unit 110, with the passband center frequency Fc of the millimeter-wave band filter 20 being fixed, and changes the passband center frequency Fc of the millimeter-wave band filter 20 in a step close to the passband width is repeated to acquire spectrum data of a desired observation frequency range is referred to as a second control mode.

As such, the control unit 120 controls the passband center frequency of the millimeter-wave band filter 20 and the sweep of the spectrum detection unit 110 in two modes on the basis of the observation frequency range or required frequency resolution.

In addition, the control unit 120 performs a level correction process for correcting a level variation due to a variation in the frequency characteristics of the millimeter-wave band filter 20, the frequency conversion unit 100, and spectrum detection unit 110 in the overall bandwidth, in addition to the frequency-related control.

Since the frequency characteristics of the frequency conversion unit 100 or the spectrum detection unit 110 do not depend on the two control modes, correction data for correcting the spectrum detected when the reference signal with a known level is input in the entire observation band may be prepared in advance and level correction may be performed for each frequency with the correction data.

In addition, for the millimeter-wave band filter 20, it is necessary to change data used for correction according to the two control modes. That is, in the first control mode, the problem is only a loss variation at the passband center frequency of the filter. Therefore, as shown in (b) of FIG. 3, loss values Loss1, Loss2, . . . at each passband center frequency are calculated in a step of 10 MHz using the reference signal with a known level and are then stored. When sweeping is performed in the first control mode, the correction process is performed on the basis of the loss data.

In the second control mode, the problem is both the loss of the passband center frequency of the filter and the loss characteristics (that is, the shape of the passband characteristics of the filter) of passband widths (in this example, ±100 MHz) which are on both sides of passband center frequency. Therefore, as shown in (b) of FIG. 4, loss values Loss(1, 1), Loss(1, 2), . . . in the entire passband are calculated with the assumed frequency resolution. When sweeping is performed in the second control mode, the correction process is performed on the basis of loss data for the entire passband at each passband center frequency of the filter.

When the above-mentioned control is performed, it is possible to analyze the spectrum of a signal in a millimeter-wave band, particularly, a millimeter-wave band greater than 100 GHz.

Next, the measurement result obtained by the spectrum analysis device 10 having the above-mentioned structure will be described.

Figure 5:
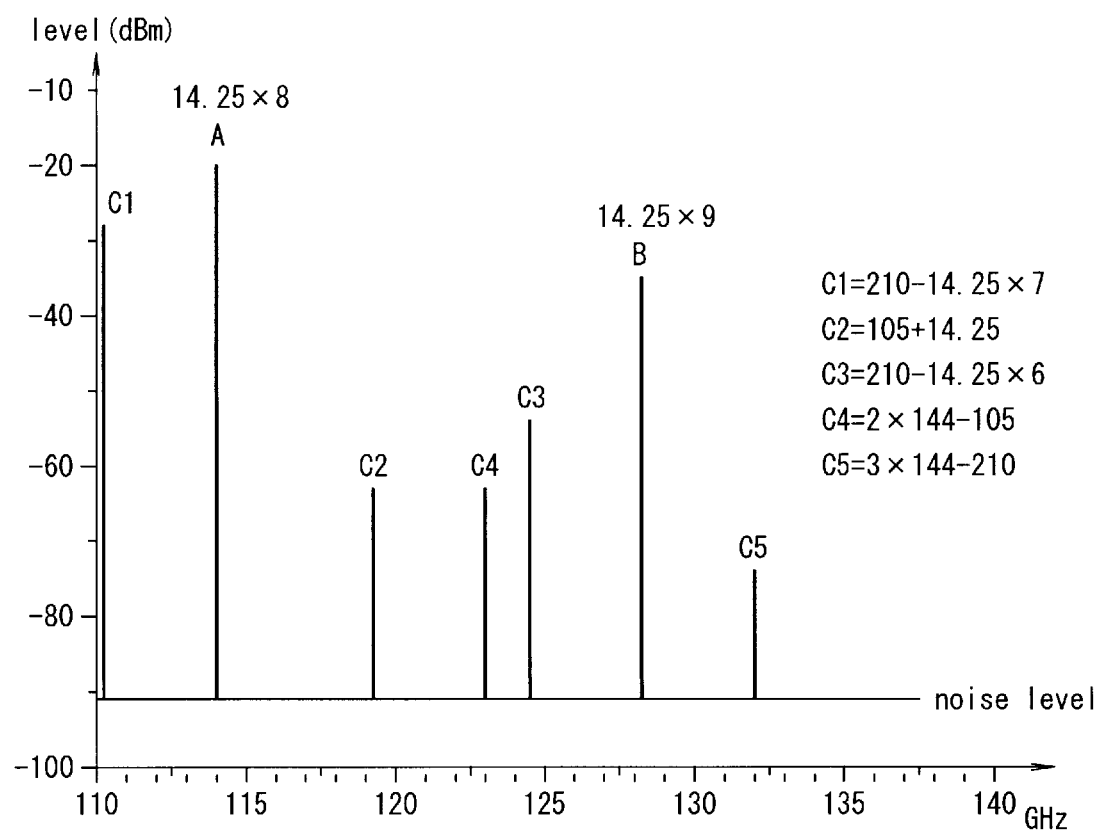
FIG. 5 is a diagram illustrating an example of an observation spectrum when the millimeter-wave band filter is not provided.

FIG. 5 shows a spectrum waveform which is observed when an output signal (about −20 dBm) from a multiplier (harmonic generator) that multiplies a frequency of 14.25 GHz of the original signal is input to the spectrum analysis device 10 without the millimeter-wave band filter 20 in the above-mentioned numerical example.

Originally, only a spectrum component A with a frequency of 114 GHz that is eight times more than 14.25 GHz and a spectrum component B with a frequency of 128.25 GHz that is nine times more than 14.25 GHz are observed in a frequency range of 110 GHz to 140 GHz. However, the following frequency components appear: a frequency component C1 (110.25 GHz) which is the difference between a frequency component (99.75 GHz) that is seven times more than 14.25 GHz and a frequency component that is two times more than the frequency, 105 GHz, of the first local signal; a frequency component C2 (119.25 GHz) which is the sum of the fundamental wave (14.25 GHz) and the first local signal; a frequency component C3 which is the difference between a frequency component (85.5 GHz) that is six times more than 14.25 GHz and a frequency component that is two times more than the frequency of the first local signal; a frequency component C4 (123 GHz) which is the difference between a frequency component that is two times more than the frequency component which is eight times more than 14.25 GHz and the frequency of the first local signal; and a frequency component C5 (132 GHz) which is the difference between a frequency component that is three times more than the frequency component which is eight times more than 14.25 GHz and a frequency component that is two times more than the frequency of the first local signal.

Figure 6:
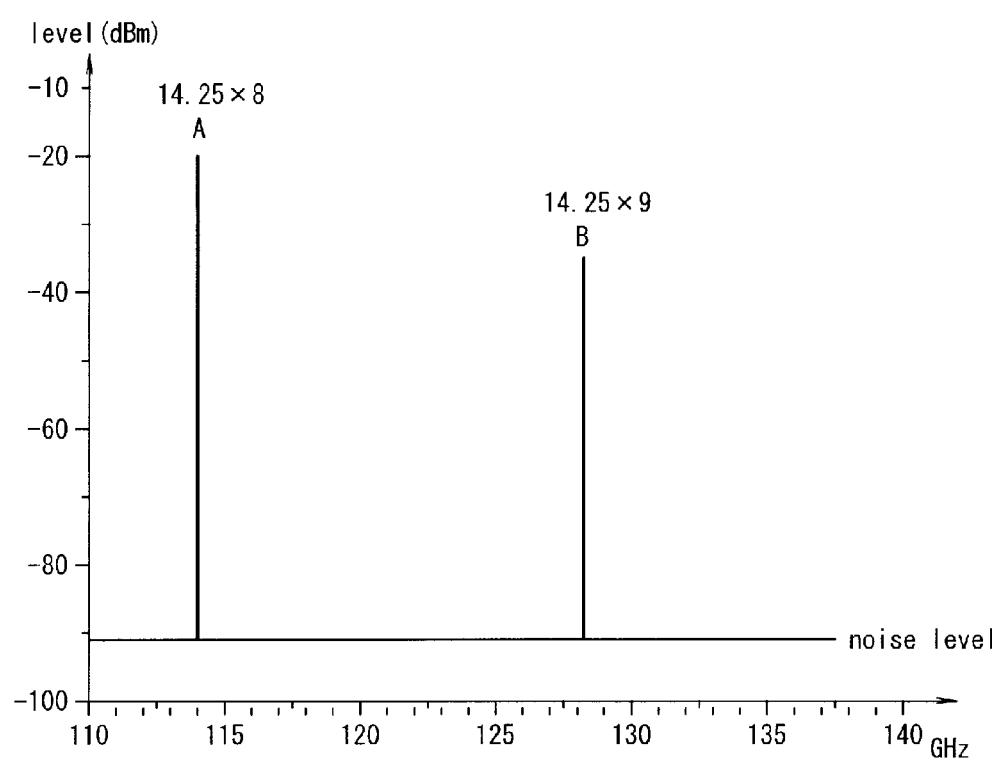
FIG. 6 is a diagram illustrating an example of the observation spectrum when the millimeter-wave band filter is provided.

In this state, the millimeter-wave band filter 20 is inserted and observation is performed in the second control mode (the passband center frequency is changed in a step of 300 MHz). The observation result is shown in FIG. 6. As can be seen from FIG. 6, the levels of spurious components (C1 to C5) generated by the frequency conversion unit 100 are noise levels, only an eightfold component and a ninefold component in a frequency band of 110 GHz to 140 GHz among the frequency components of the input signal are observed, and spectrum analysis is correctly performed in a millimeter-wave band higher than 100 GHz.

Figure 23:
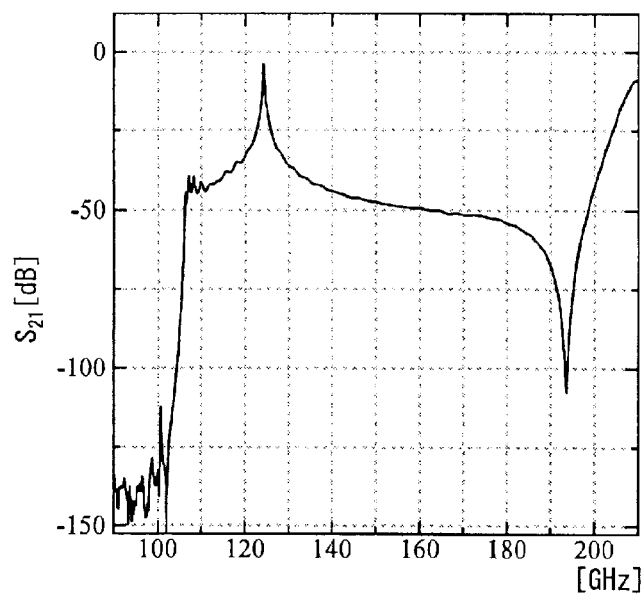
FIG. 23 is a diagram illustrating the simulation result of filter characteristics when only the high-pass filter is provided.

The characteristics shown in FIG. 6 use a structure in which a high-pass filter is added in a millimeter-wave band filter 220, which will be described below, to increase the amount of attenuation in a frequency band equal to or less than 103 GHz, as shown in FIG. 23. The effect of preventing spurious emission due to frequency components from the fundamental wave to a sevenfold wave is improved by the addition of the high-pass characteristics.

Next, the basic structure of the millimeter-wave band filter 20 will be described.

Figure 7:
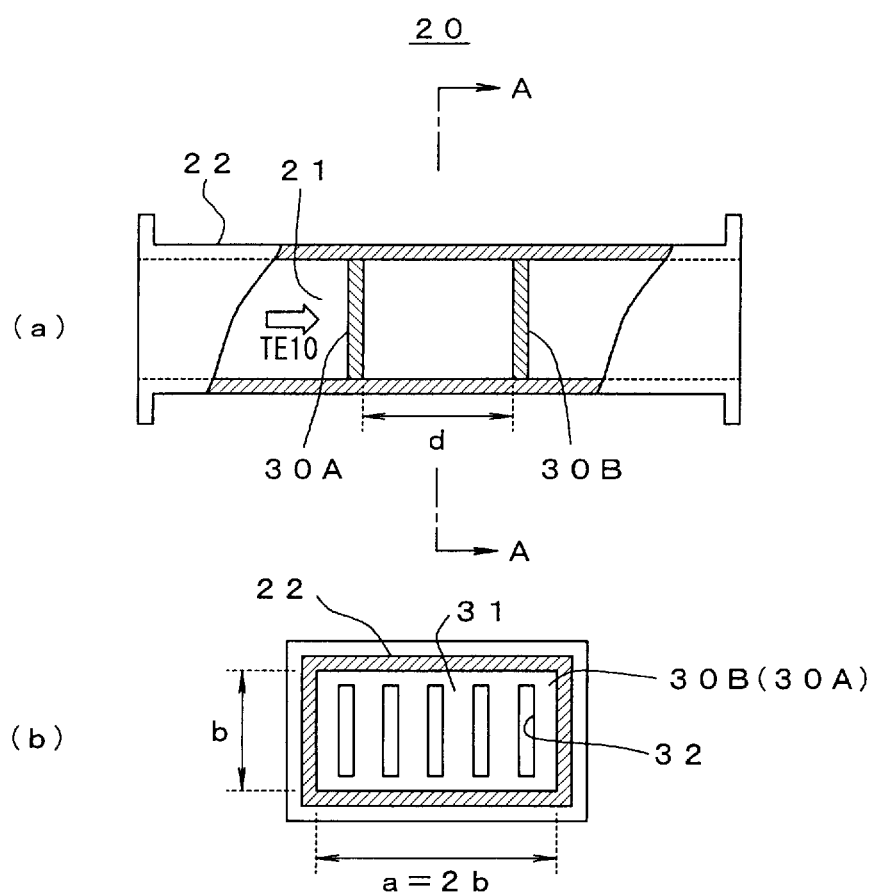
FIG. 7 is a diagram illustrating the basic structure of the millimeter-wave band filter.

As shown in FIG. 7, the millimeter-wave band filter includes the transmission line 21 that has a predetermined length and is formed by a rectangular waveguide 22 with an inside size (for example, an inside size a×b=2.032 mm×1.016 mm) capable of propagating electromagnetic waves in a predetermined millimeter-wave frequency range (for example, 110 GHz to 140 GHz) in the TE10 mode and the pair of planar radio wave half mirrors 30A and 30B that are arranged so as to be opposite to each other with the distance d therebetween while blocking the inside of the transmission line 21, transmit some of the electromagnetic waves in the predetermined frequency range which is propagated in the TE10 mode, and reflect some of the electromagnetic waves. In addition, (a) of FIG. 7 is a side view and (b) of FIG. 7 is a cross-sectional view taken along the line A-A.

In FIG. 7, one continuous rectangular waveguide 22 is used as the simplest structure for forming the transmission line 21. However, as the structure for obtaining a variable frequency with ease, the transmission line 21 may be formed in a structure in which two or three waveguides are connected, which will be described below.

As shown in (b) of FIG. 7, the radio wave half mirrors 30A and 30B each have a structure in which slits 32 for transmitting electromagnetic waves are provided in a rectangular metal plate 31 that is inscribed in the transmission line 21 and transmit the electromagnetic waves with transmittance corresponding to the shape or area of the slits 32.

In the millimeter-wave band filter 20 having the above-mentioned basic structure, a plane-type Fabry-Perot resonator is formed which resonates at a half wavelength as an electrical length (the electrical length is determined by the physical length d and the internal permittivity) between the pair of radio wave half mirrors 30A and 30B which are opposite to each other. The millimeter-wave band filter 20 can selectively transmit only the frequency component having the resonance frequency as the center frequency.

The transmission line 21 is formed in a waveguide tube structure as a closed transmission path which has a very small loss in the millimeter-wave band and uses TE waves in which the electric field is formed only in the plane perpendicular to the traveling direction. Therefore, for example, a wave surface conversion process is not needed and it is possible to output only the signal component extracted by the resonator in the TE10 mode with a very small loss.

Figure 8:
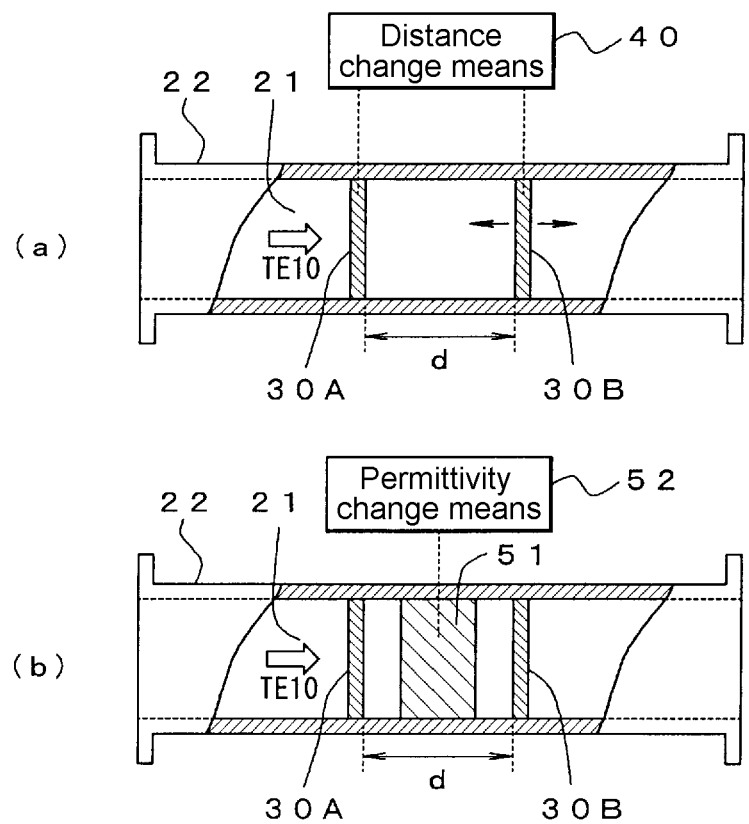
FIG. 8 is a diagram illustrating a structure for changing a resonance frequency of a filter.

It is possible to freely change the electrical length (that is, the resonance frequency) between the mirrors by changing the distance d between the radio wave half mirrors 30A and 30B using distance change means 40 as shown in (a) of FIG. 8, changing the permittivity of a dielectric 51 inserted between the mirrors using the electric signal from permittivity change means 52 as shown in (b) of FIG. 8, or combining the two methods. Therefore, it is possible to achieve a variable-frequency filter with a very small loss in the millimeter-wave band.

In the basic structure, various structures are considered as the distance change means 40. When the transmission line is formed by one continuous waveguide as in the above-mentioned example, a mechanism is considered in which one radio wave half mirror 31 is fixed at a predetermined position in the tube and the other radio wave half mirror 32 slides in the tube. In addition, for example, liquid crystal can be used as the dielectric 51 for changing permittivity.

Next, the detailed structure of the frequency-variable millimeter-wave band filter will be described.

Figure 9:
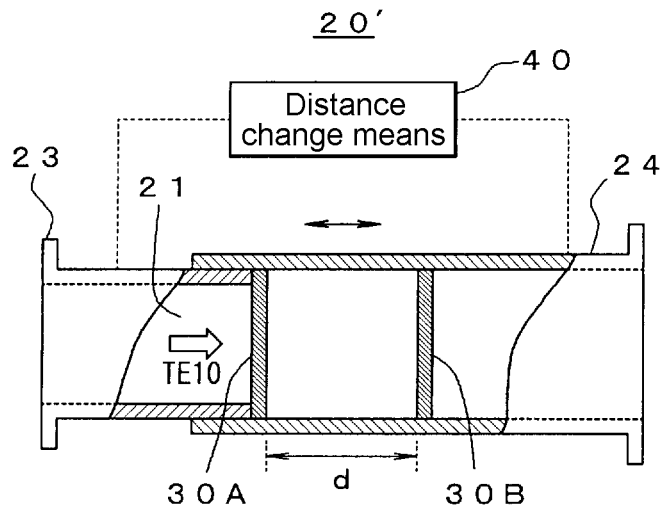
FIG. 9 is a diagram illustrating an example of a structure using two waveguides with different sizes.

FIG. 9 shows a millimeter-wave band filter 20' in which a transmission line 21 includes a first waveguide 23 and a second waveguide 24 which have different sizes.

The first waveguide 23 which forms the transmission line 21 of the millimeter-wave band filter 20' is a rectangular waveguide with an inside size (for example, an inside size a×b=2.032 mm×1.016 mm) capable of propagating electromagnetic waves in a predetermined millimeter-wave frequency range (for example, 110 GHz to 140 GHz) in the TE10 mode, similarly to the above. One radio wave half mirror 30A is fixed so as to block one end of the first waveguide 23.

The second waveguide 24 is connected to the first waveguide 23 so as to be circumscribed about one end of the first waveguide 23 and the other radio wave half mirror 30B is fixed in the second waveguide 24.

In the structure in which the waveguides 23 and 24 with different sizes are connected to each other and the radio wave half mirrors 30A and 30B are respectively fixed to the waveguides 23 and 24, the first waveguide 23 and the second waveguide 24 are slid so as to be expanded or contracted by the distance change means 40 while being connected to each other. Therefore, it is possible to change the distance d between the pair of radio wave half mirrors 30A and 30B and freely set the resonance frequency.

In this structure, the inside size of the second waveguide 24 is equal to the sum of the inside size of the first waveguide 23, the thickness of the first waveguide 23, and a sliding clearance. Therefore, the range of frequency which can be propagated in the TE10 mode shifts to a frequency range lower than that of the first waveguide 23. When the sum of the thickness of the waveguide and the sliding clearance with respect to the inside size (about 2 mm×1 mm) is about 0.1 mm, it is possible to reduce the shift amount.

Figure 10:
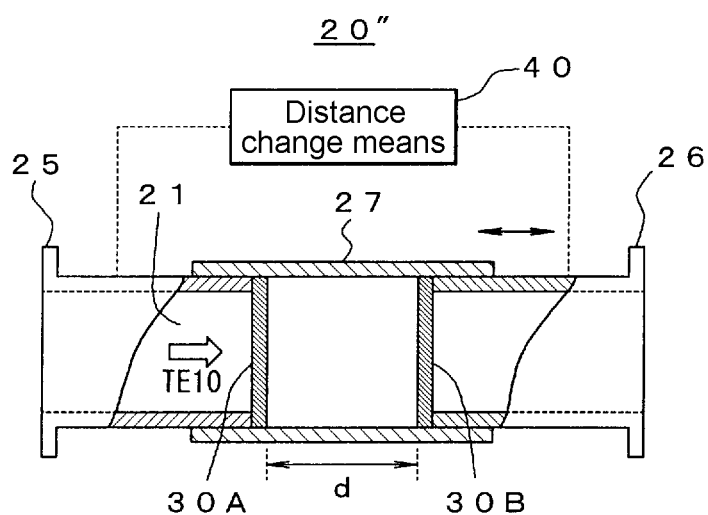
FIG. 10 is a diagram illustrating an example of a structure using three waveguides.

FIG. 10 shows a millimeter-wave band filter 20" in which a transmission line 21 is formed by first and second waveguides 25 and 26, which are the same type, and a third waveguide 27 with a size that is slightly more than that of the first and second waveguides 25 and 26.

The first waveguide 25 and the second waveguide 26 forming the transmission line 21 of the millimeter-wave band filter 20" are rectangular waveguides (WR-08) with an inside size (for example, an inside size a×b=2.032 mm×1.016 mm) capable of propagating electromagnetic waves in a predetermined millimeter-wave frequency range (for example, 110 GHz to 140 GHz) in the TE10 mode, similarly to the above. One radio wave half mirror 30A is fixed so as to block one end of the waveguide.

In addition, the second waveguide 26 which is the same type as the first waveguide 25 is provided such that one end thereof is arranged coaxially with one end of the first waveguide 25 while facing the one end of the first waveguide 25 and the other radio wave half mirror 30B is fixed so as to block one end of the second waveguide 26.

The third waveguide 27 has an inside size so as to be circumscribed about the first waveguide 25 and the second waveguide 26 and holds and connects the first and second waveguides 25 and 26 while being circumscribed about one end of each of the first waveguide 25 and the second waveguide 26. Here, similarly to the waveguide 24, the inside size of the third waveguide 27 is equal to the sum of the inside size of the first waveguide 25 or the second waveguide 26, the thickness of the first waveguide or the second waveguide 26, and a sliding clearance. When the sum is very small relative to the size, it is possible to reduce a reduction in a frequency range which can be propagated in the TE10 mode (single mode).

Similarly to the above, at least one of the first waveguide 25 to which one radio wave half mirror 30A is fixed and the second waveguide 26 to which the other radio wave half mirror 30B is fixed is slid by the distance change means 40 while being held by the third waveguide 27 so as to be inscribed in the third waveguide 27. Therefore, it is possible to change the distance d between the pair of radio wave half mirrors 30A and 30B and freely set the resonance frequency.

In the millimeter-wave band filter 20", both ends of the transmission line 21 are formed by the waveguides 25 and 26 with the same size and a waveguide with a standard size capable of propagating electromagnetic waves in a frequency range of 110 GHz to 140 GHz in the TE10 mode can be used. A general-purpose waveguide is used for connecting electromagnetic waves to an input/output circuit, without any change. Therefore, it is very easy to construct a circuit including a filter. When a waveguide having the same size as the first waveguide 23 is provided at the other end of the second waveguide 24 having the structure shown in FIG. 9, it is possible to use a general-purpose waveguide for connection to another circuit, similarly to the millimeter-wave band filter 20".

Next, the simulation result of the millimeter-wave band filter 20" having the structure shown in FIG. 10 will be described below. In the simulation, for simplicity, a perfect conductor is used as a material and a model in which there is no conductor loss is used.

Figure 11:
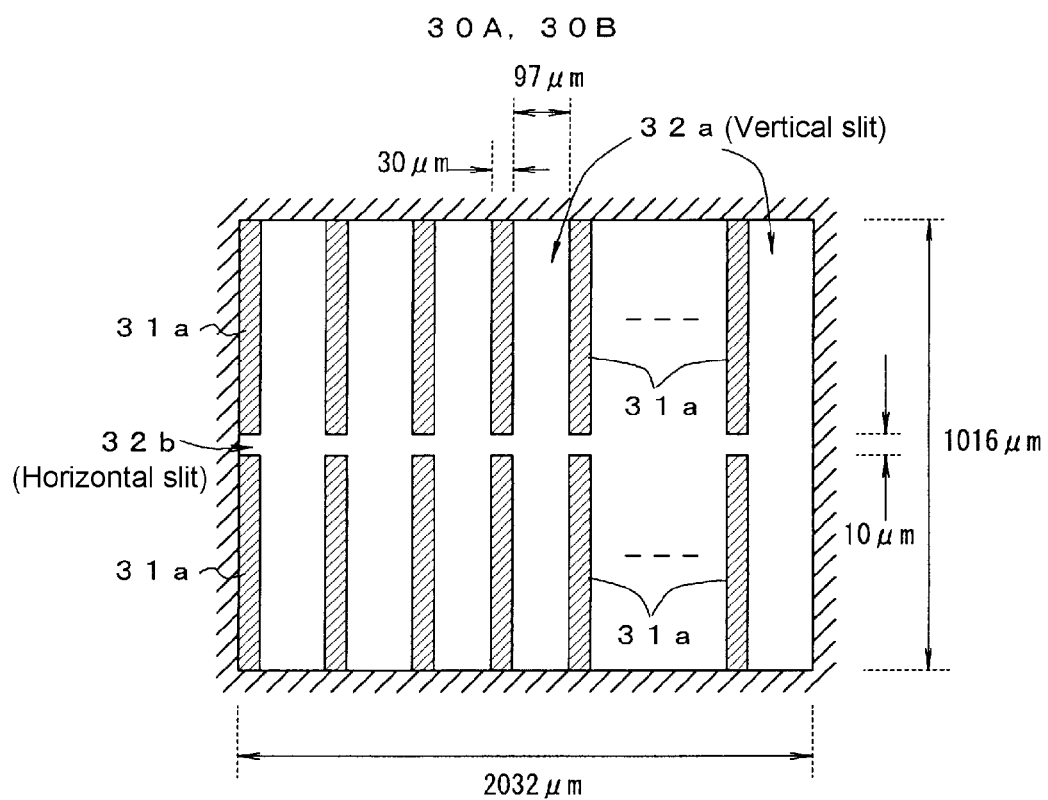
FIG. 11 is a diagram illustrating the structure of a radio wave half mirror used in simulations.
Figure 12:
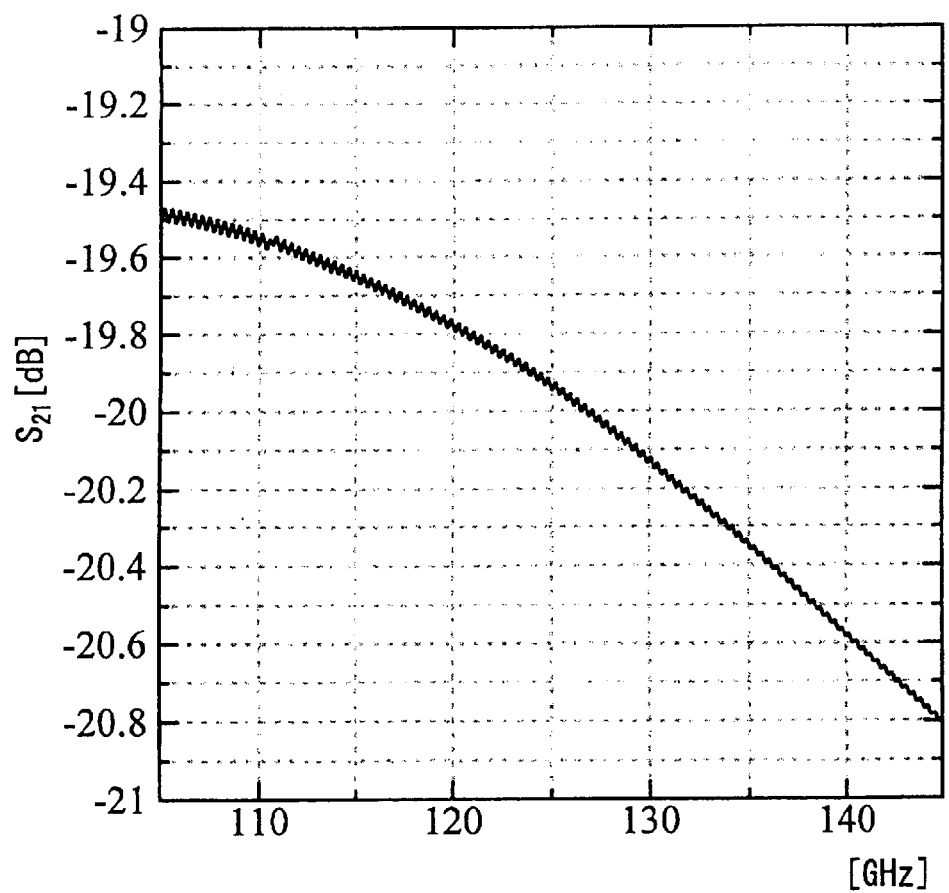
FIG. 12 is a diagram illustrating the frequency characteristics of the radio wave half mirror used in simulations.

The first waveguide 25 and the second waveguide 26 are waveguides (an inside size of 2.032 mm×1.016 mm) which has a standard size and a thickness of 0.1 mm. As shown in FIG. 11, the radio wave half mirrors 30A and 30B which are fixed to the leading ends of the first waveguide and the second waveguide 26 each have a rectangular shape which is entirely inscribed in the waveguide and have a structure in which metal strips 31a, each of which has a thickness of 100 μm and a width of 30 μm and extends in the short side direction, are arranged in the long side direction (horizontal direction) in two stages, that is, the upper and lower stages, with a vertical slit 32a having a width of 97 μm interposed therebetween, and a horizontal slit 32b with a width of 10 µm is provided between the metal strips 31a. FIG. 12 shows the frequency characteristics of the transmittance S21 of the radio wave half mirrors 30A and 30B.

Figure 13:
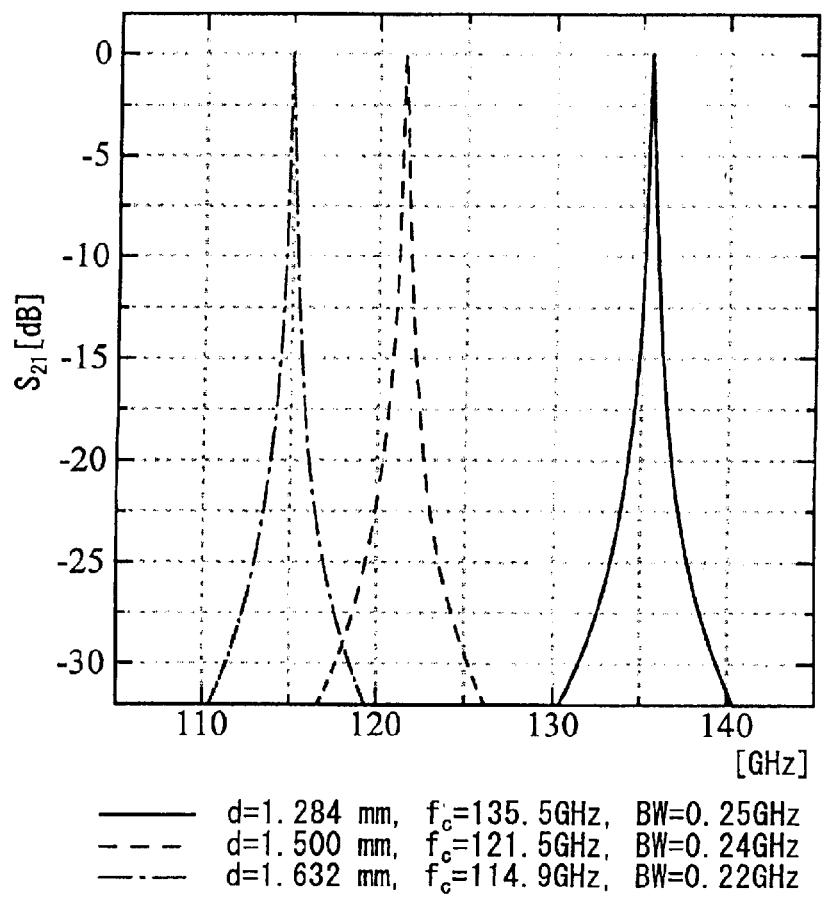
FIG. 13 is a diagram illustrating the frequency characteristics of a filter including three waveguides at different distances between the mirrors.

FIG. 13 shows the frequency characteristics of the transmittance S21 of the entire filter when the distance d between the radio wave half mirrors 30A and 30B is changed. The resonance frequency is changed to 135.5 GHz, 121.5 GHz, and 114.9 GHz in correspondence with the distance d=1.284 mm, 1.500 mm, and 1.632 mm, respectively. The peak value of each resonance characteristic is nearly 0 dB and very low loss (that is, narrow band) characteristics are obtained in the wide frequency range. These characteristics show that the deterioration of filter characteristics due to the size of the third waveguide 27 which is slightly more than the standard size is very small.

The structure of the half mirrors used in the simulation does not limit the invention and the position and shape of the slits may be arbitrarily changed.

In the millimeter-wave band filters 20' and 20", the distance change means 40 slides the waveguide to change the distance between the radio wave half mirrors 30A and 30B, thereby changing the resonance frequency. However, the permittivity change means 52 which changes the permittivity of the dielectric 51 provided between the mirrors in response to electric signals from the outside may be used, in addition to the change of the distance by the distance change means 40. In this case, it is possible to perform fine variable control for the resonance frequency.

In order to slide the first waveguide 23 relative to the second waveguide 24 using the two-transmission line structure shown in FIG. 9, it is necessary to provide a gap required for the sliding. When the gap is large, the electromagnetic waves between the radio wave half mirrors leak to the outside. As a result, the filter characteristics deteriorate significantly.

For example, in the case of a waveguide with a size of 2 mm×1 mm, an acceptable gap G is equal to or less than 20 µm. However, the range of the acceptable gap G is insufficient to completely prevent the leakage of electromagnetic waves.

Figures 14, 15:
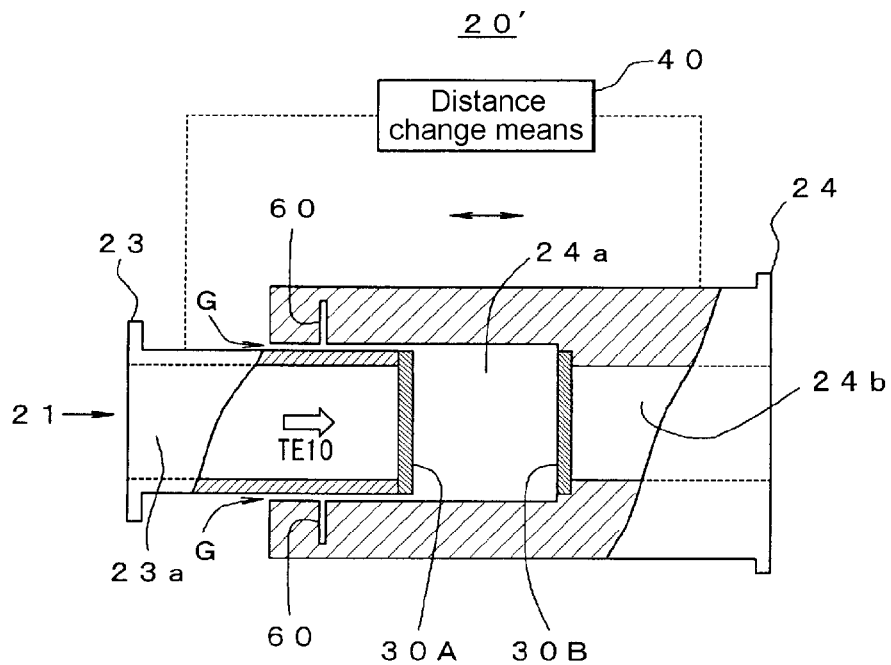
FIG. 14 is a diagram illustrating the structure of a filter including two waveguides and a groove for preventing the leakage of electromagnetic waves.
FIG. 15 is a diagram illustrating the simulation result showing that filter characteristics vary depending on whether the groove for preventing the leakage of electromagnetic waves is provided.

When the characteristics in which the leakage of electromagnetic waves is not negligible are required, the structure shown in FIG. 14 may be used.

That is, in the second waveguide 24, a first transmission line 24a with a size which can receive one end of the first waveguide 23 and includes a gap G required for sliding is formed integrally with a second transmission line 24b which has the same size as the transmission line 23a of the first waveguide 23 while being concentrically connected to the second transmission line 24b. In addition, a groove 60 which has a predetermined depth and is used to prevent the leakage of electromagnetic waves is formed around the inner circumferential wall of the first transmission line 24a which is opposite to the outer circumference of the first waveguide 23 with the gap G therebetween.

Since the groove 60 has the electromagnetic wave leakage prevention operation, the depth of the groove 60 may be set to one-fourth (for example, about 0.7 mm at 120 GHz) of the guide wavelength λg at a cutoff frequency. The width of the groove 60 is not related to the cutoff frequency, but is preferably, for example, 0.2 mm. When a wide-band cutoff frequency is used, a plurality of grooves with different depths may be formed at predetermined intervals.

Figure 16:
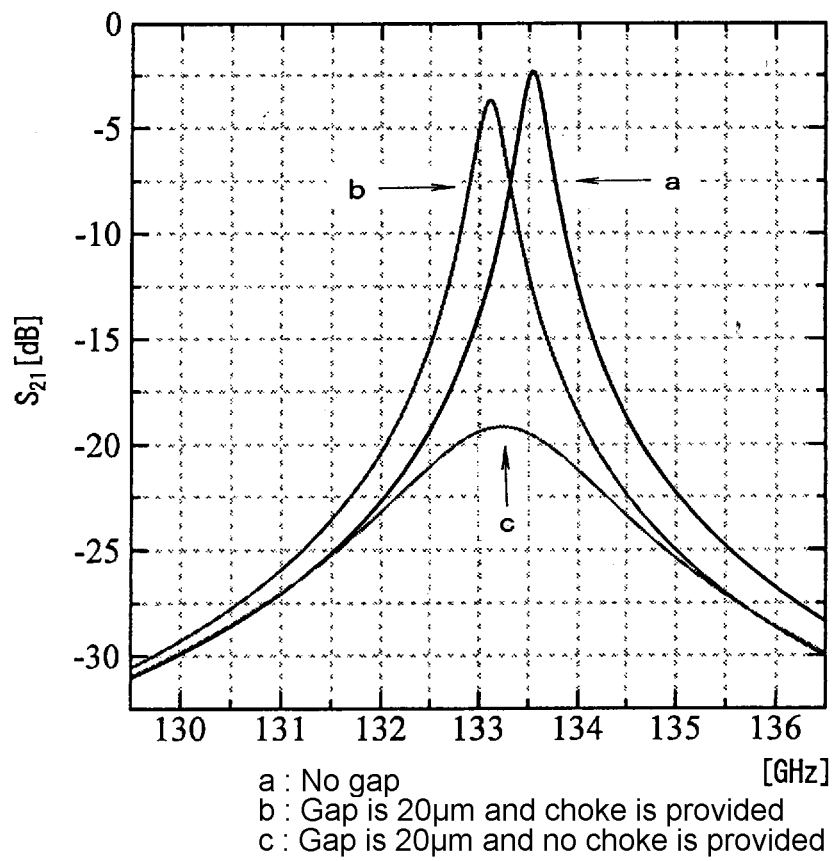
FIG. 16 is a diagram illustrating the simulation result showing that filter characteristics vary depending on whether the groove for preventing the leakage of electromagnetic waves is provided.

FIGS. 15 and 16 show the results of simulations for confirming the electromagnetic wave leakage prevention operation. FIG. 15 shows the measurement results of the center frequency, insertion loss, 3-dB bandwidth, and Q value of the filter in a state a in which there is no gap G (ideal state), a state b in which the gap G is 20 µm and a groove 60 having a depth of 0.7 mm and a width of 0.2 mm is provided, and a state c in which the gap G is 20 µm and the groove 60 is not provided. FIG. 16 shows transmission characteristics when the frequency of an input signal is variable.

The simulation results prove that, when the gap G is 20 µm and no groove is provided, the insertion loss is 16.85 dB more than that in the ideal state, the bandwidth (selectivity) is 3.4 times more than that in the ideal state, and the Q value is 29 percent of that in the ideal state. In contrast, when the gap G is 20 µm and the groove is provided, the insertion loss is 1.3 dB more than that in the ideal state, the bandwidth (selectivity) is 1.2 times more than that in the ideal state, and the Q value is 81 percent of that in the ideal state. As can be seen from the characteristic diagram shown in FIG. 16, characteristics close to the ideal state are obtained and the electromagnetic wave leakage prevention operation of the groove 60 can prevent deterioration of characteristics even when the gap G required for sliding is provided.

As described above, in the state in which a narrow gap is provided, when the first waveguide 23 is moved relative to the second waveguide 24 at a relatively high speed, the volume of the space between the pair of radio wave half mirrors 30A and 30B increases and decreases. In order to move the first waveguide 23 at a desired speed, it is necessary to apply a stronger force than necessary, without air in the space leaking from the narrow gap G (high air resistance).

When excessive force is applied, the internal pressure is changed and the thin radio wave half mirrors 30A and 30B are distorted by the pressure. As a result, the resonance frequency of the filter is likely to deviate from a desired value or large loss is likely to occur.

Figure 17:
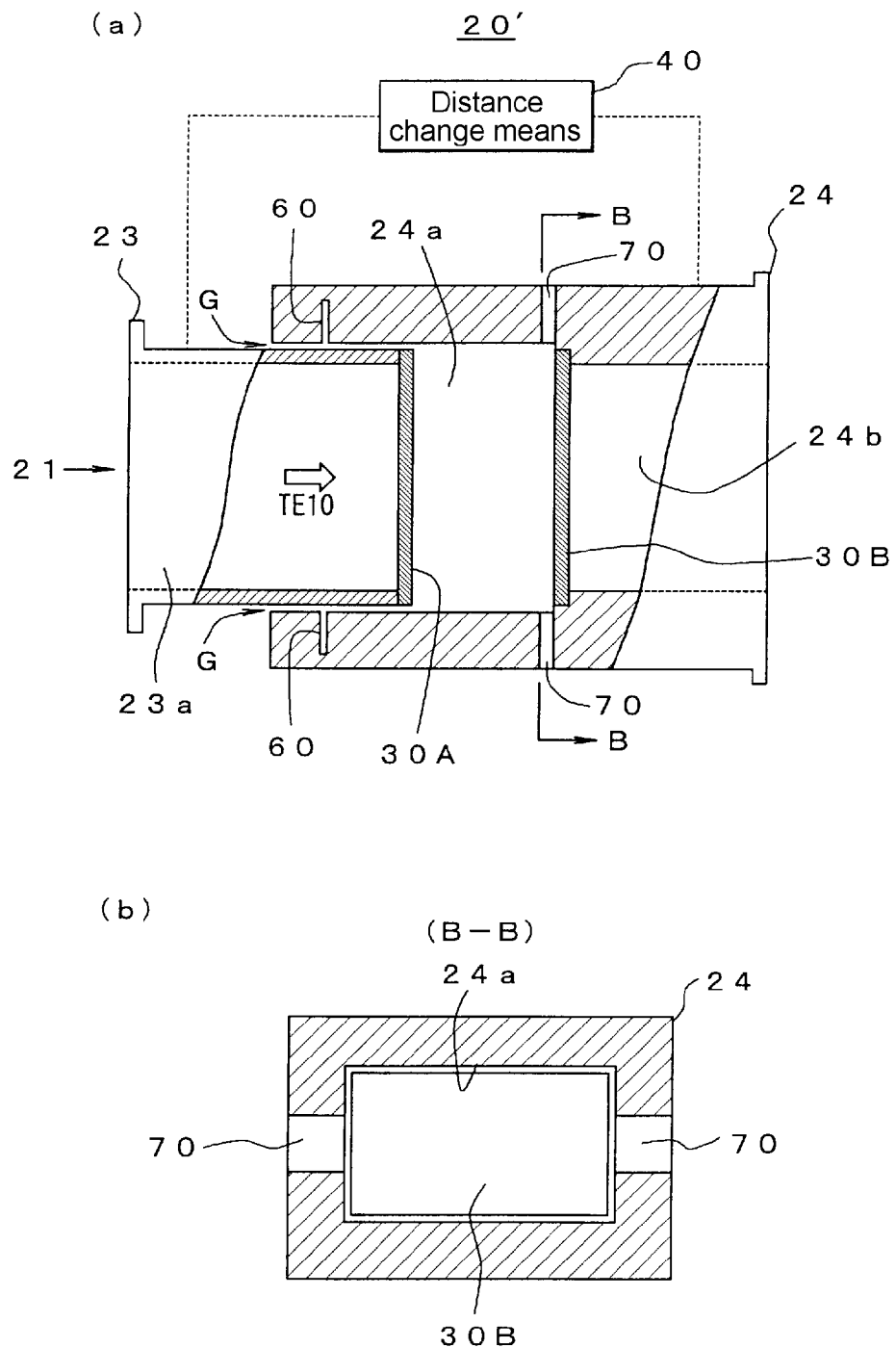
FIG. 17 is a diagram illustrating the structure of a filter including two waveguides, a groove for preventing the leakage of electromagnetic waves, and an air duct.

When the influence of the change in pressure on the filter characteristics is not negligible, as shown in the plan view of (a) of FIG. 17 and the cross-sectional view of (b) of FIG. 17, an air duct 70 which is continuous from the short-side edge of a transmission line (in this case, the first transmission line 24a of the second waveguide 24) surrounding the space between the radio wave half mirrors 30A and 30B to the outer circumference of the transmission line may be provided in the space between the radio wave half mirrors 30A and 30B to facilitate the flow of air between the space between the radio wave half mirrors 30A and 30B and the outside.

As described above, when the duct is continuously provided from the side edge to the outer circumference of the transmission line 24a, there is a concern that the duct will have an effect on the filter characteristics. It is known that the influence of a shape variation at the short side of the rectangular transmission line is less than that at the long side (there is little change in characteristics even when the width increases close to a cutoff wavelength). In addition, although not shown in the drawings, when the leakage of electromagnetic waves due to the air duct 70 is not negligible, the groove 60 which has a predetermined depth and is used to prevent the leakage of electromagnetic waves may be provided in the inner wall of the air duct 70 to prevent the leakage of electromagnetic waves.

Figure 18:
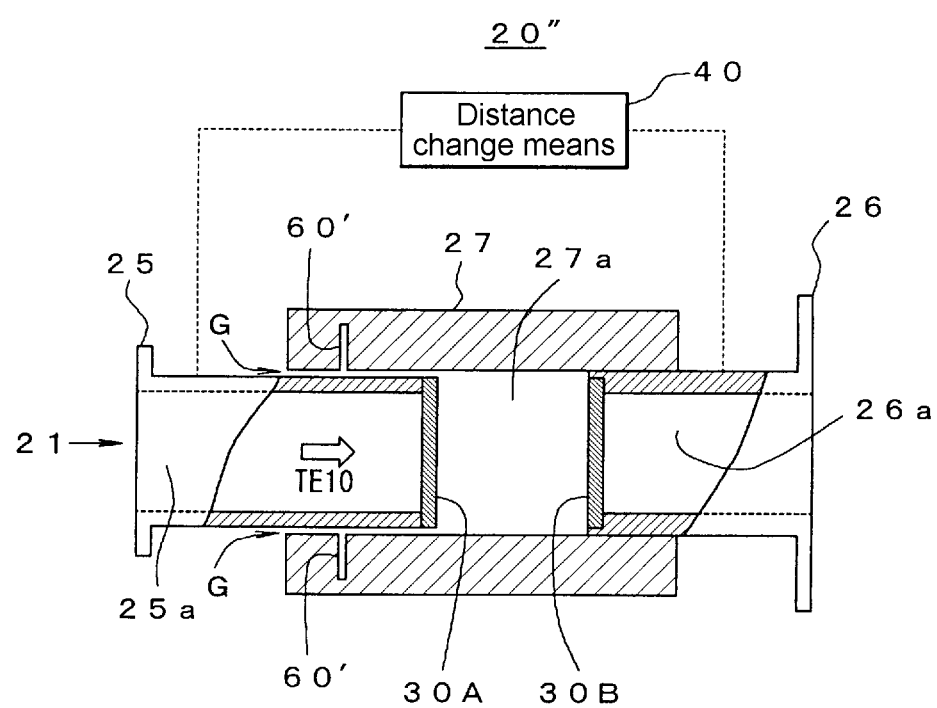
FIG. 18 is a diagram illustrating the structure of a filter including three waveguides and a groove for preventing the leakage of electromagnetic waves.

The groove for preventing the leakage of electromagnetic waves may be provided in the millimeter-wave band filter including the three waveguides. In this case, as shown in FIG. 18, transmission lines 25a and 26a have the same size and a groove 60' which has a predetermined depth and is used to prevent the leakage of electromagnetic waves is formed around the inner circumferential wall of a third waveguide 27 that faces the outer circumference of a waveguide (in this example, a first waveguide 25), which slides relative to the third waveguide 27, of the first waveguide 25 and a second waveguide 26 that are moved into the third waveguide 27 so as to be inscribed in a transmission line 27a of the third waveguide 27, with the gap G therebetween. In this way, it is possible to prevent electromagnetic waves between a pair of radio wave half mirrors 30A and 30B from leaking from the gap G required for sliding and to maintain good filter characteristics. Here, the second waveguide 26 is fixed to the third waveguide 27 and is integrally moved relative to the first waveguide 25.

Figure 19:
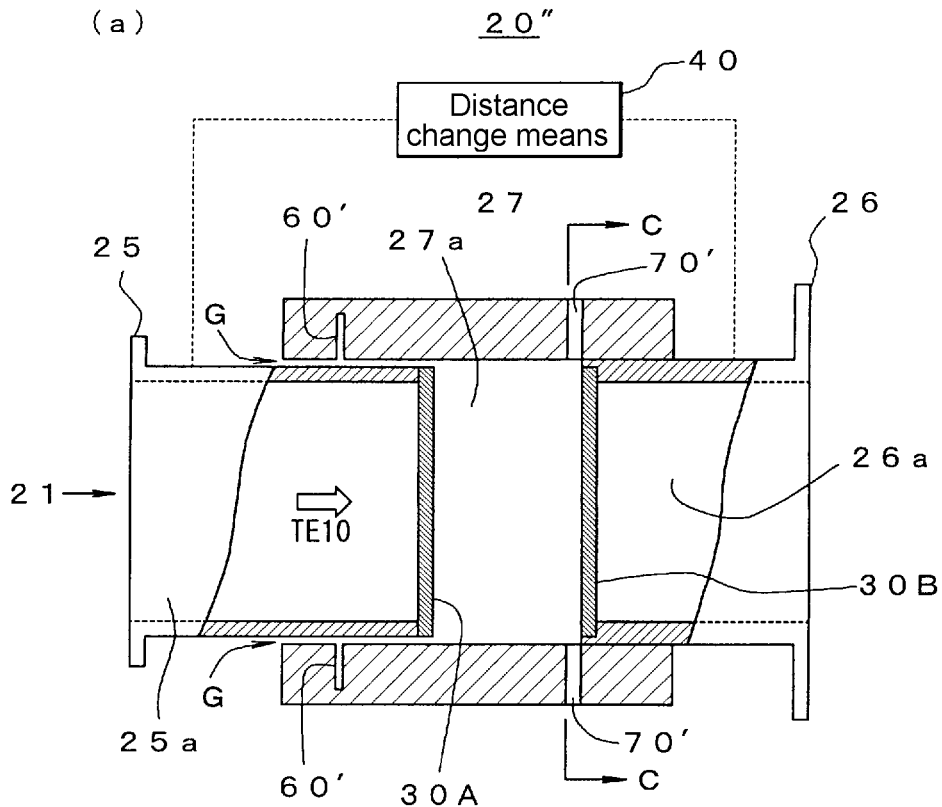
FIG. 19 is a diagram illustrating the structure of a filter including three waveguides, a groove for preventing the leakage of electromagnetic waves, and an air duct.
Figure 19:
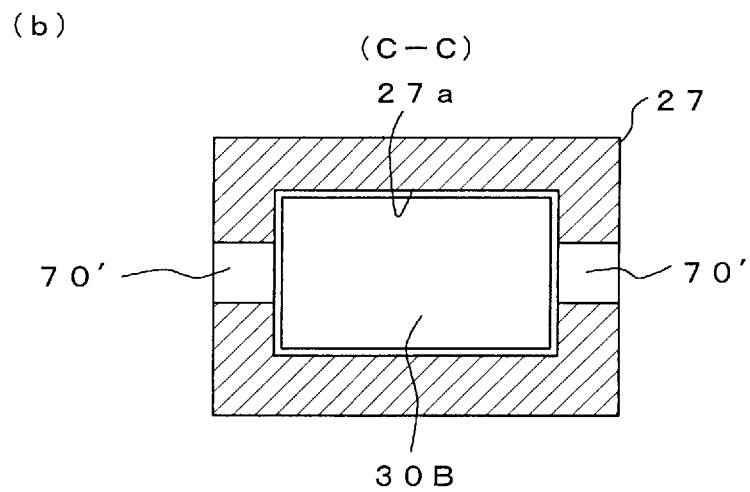

In the millimeter-wave band filter including the three waveguides, as shown in FIG. 19, an air duct 70' which is continuous from the short-side edge of the transmission line 27a of the third waveguide 27 surrounding the space between the pair of radio wave half mirrors 30A and 30B to the outer circumference of the transmission line may be provided in the space between the radio wave half mirrors 30A and 30B. In this case, even when the gap G required for sliding is small, the air duct 70' makes it possible to reduce air resistance when the frequency is changed. Therefore, it is possible to prevent the distortion of the radio wave half mirrors due to the air resistance and force more than necessary is not applied for sliding.

Figure 20:
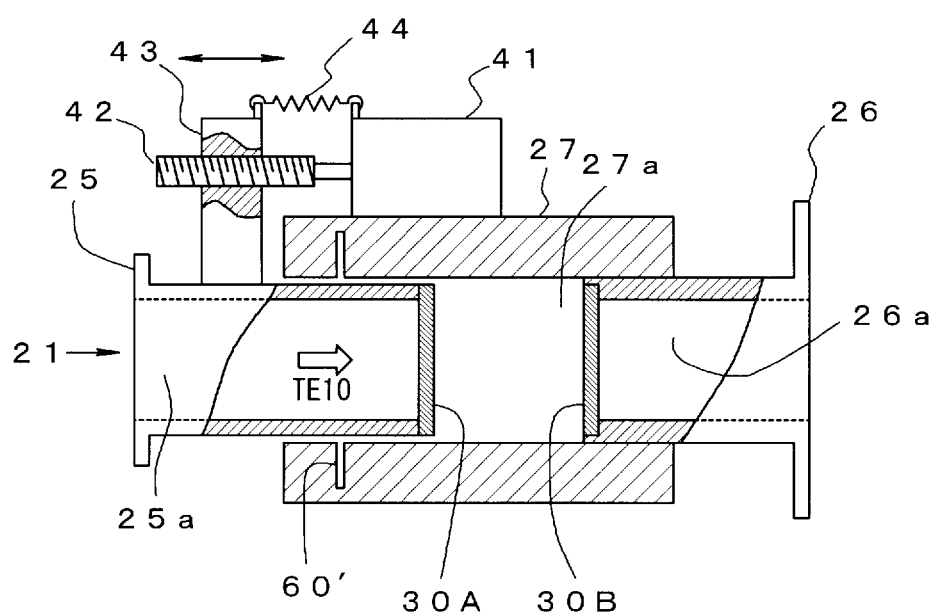
FIG. 20 is a diagram illustrating an example of the structure of a driving unit of a distance change mechanism.

For example, as shown in FIG. 20, a driving unit of the distance change means 40 can include a stepping motor which is a driving source, a screw body 42 which is rotated by the driving of the driving unit, and a connection member 43 which includes a screw hole engaged with the screw body 42, is connected integrally with a waveguide holding a movable radio wave half mirror, and is moved in predetermined steps in the length direction of the waveguide by the screw body 42 that is rotated at a predetermined angle by the driving of the stepping motor 41 to change the distance between the radio wave half mirrors. In addition, a coil spring 44 pulls the connection member 43 in the length direction of the transmission line to prevent backlash caused by a narrow gap between the screw body 42 and the screw hole.

In the above-described embodiment, the waveguide holding the radio wave half mirror is moved. However, any structure may be used as long as it can move a holding body which holds the radio wave half mirror in the transmission line. The waveguide forming the transmission line does not necessarily slide.

In general, when a sufficient amount of stopband attenuation is not obtained by the resonance filter, the filters are cascaded in the related art. However, when the millimeter-wave band filters in which a pair of radio wave half mirrors are arranged in the transmission line of the waveguide so as to be opposite to each other are cascaded in order to increase the amount of stopband attenuation, the filters interfere with each other and it is difficult to obtain desired characteristics.

Figure 21:
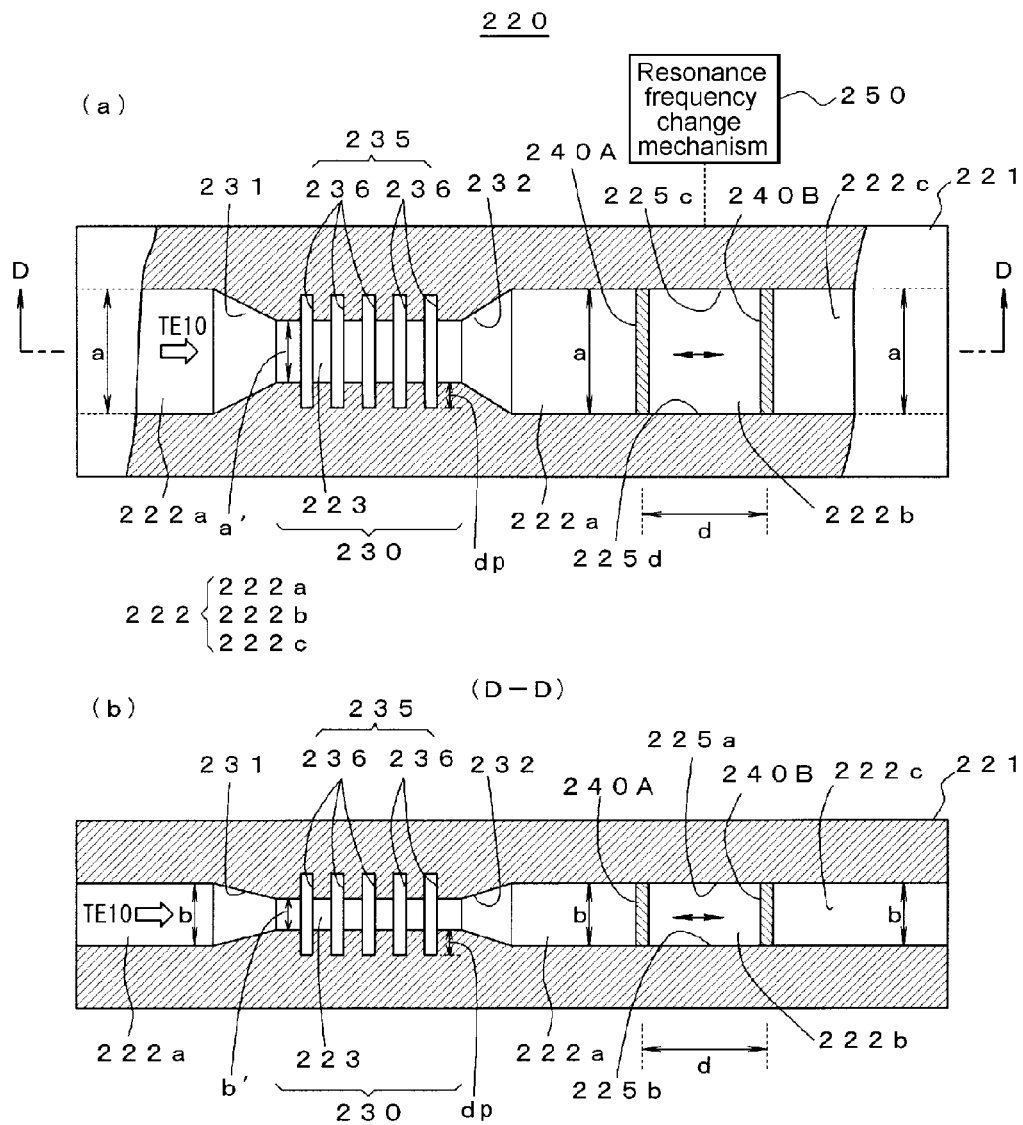
FIG. 21 is a diagram illustrating the basic structure of a millimeter-wave band filter including a high-pass filter and a band rejection filter.

Next, an example of the structure of a filter which solves the above-mentioned problems and increases the amount of stopband attenuation on both sides of a desired passband (110 GHz to 140 GHz) will be described. FIG. 21 shows the basic structure of the millimeter-wave band filter 220 which increases the amount of stopband attenuation.

As shown in the side view of (a) of FIG. 21, the millimeter-wave band filter 220 includes a waveguide 221, a pair of radio wave half mirrors 240A and 240B, and a resonance frequency change mechanism 250 (corresponding to the distance change means 40 in the above-described embodiment).

In the waveguide 221, a transmission line 222 which is a hollow rectangular tube, has a rectangular shape in a cross-sectional view, and has a size (for example, a standard size a×b=2.032 mm×1.016 mm) capable of propagating electromagnetic waves in a predetermined millimeter-wave frequency band (for example, from 110 GHz to 140 GHz) in the TE10 mode is continuously formed from one end to the other end of the waveguide, except for a high-pass filter 230 which will be described below.

The pair of radio wave half mirrors 240A and 240B which transmit some of the electromagnetic waves in the predetermined frequency range and reflect some of the electromagnetic waves are arranged in the waveguide 221 so as to block the transmission line 222 and to be opposite to each other with a distance d (for example, about 1.4 mm) therebetween. The transmission line 222 is partitioned by a first transmission line 222a which extends from one end (the left end in (a) of FIG. 21) to the radio wave half mirror 240A, a second transmission line 222b which extends between the radio wave half mirrors 240A and 240B, and a third transmission line 222c which extends from the radio wave half mirror 240B to the other end (the right end in (a) of FIG. 21).

Figure 22:
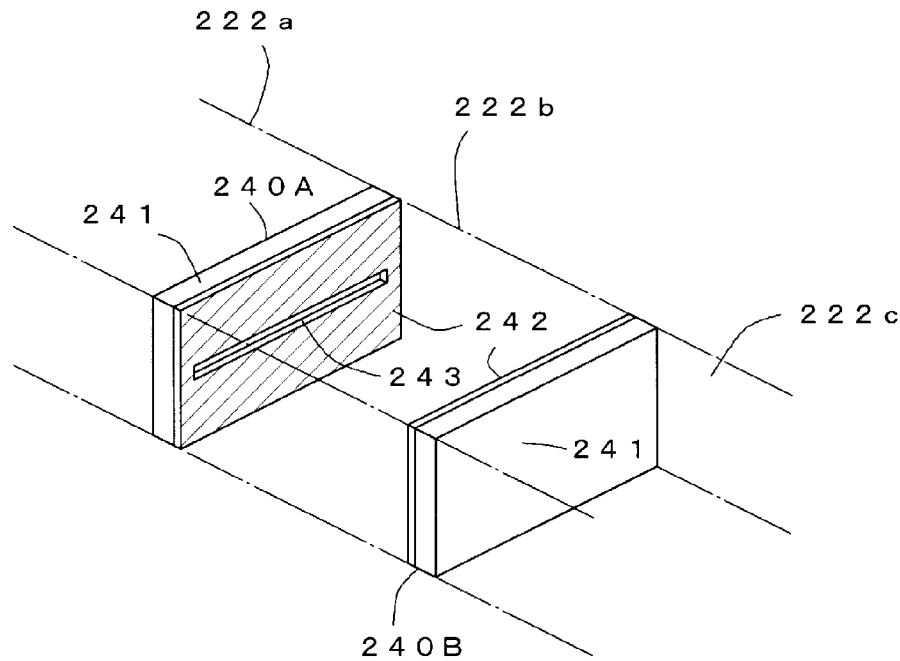
FIG. 22 is a diagram illustrating an example of the structure of a radio wave half mirror.

For example, as shown in FIG. 22, the pair of radio wave half mirrors 240A and 240B each include a rectangular dielectric substrate 241 with a size corresponding to the size of the fixed transmission line, a metal film 242 which covers the surface of the dielectric substrate 241, and a slit 243 which is provided in the metal film 242 and transmits electromagnetic waves, are fixed with the outer circumference of the metal film 242 coming into contact with the inner wall of the transmission line, and transmit electromagnetic waves with transmittance corresponding to the shape or area of the slit 243.

In the millimeter-wave band filter 220 having the above-mentioned basic structure, a plane-type Fabry-Perot resonator is formed by the pair of radio wave half mirrors 240A and 240B and it is possible to selectively transmit only a frequency component centered on the resonance frequency.

The transmission line 222 is formed in a waveguide structure as a closed transmission path which has a very small loss in the millimeter-wave band and has a size capable of propagating electromagnetic waves only in the TE10 mode. Therefore, for example, a wave surface conversion process is not needed, and it is possible to output only the signal component extracted by the resonator with a very small loss.

The resonance frequency change mechanism 250 is used to change the resonance frequency of a resonator which is formed by the pair of radio wave half mirrors 240A and 240B and the second transmission line 222b provided between the pair of radio wave half mirrors 240A and 240B. As a method of changing the resonance frequency, the resonance frequency change mechanism 250 changes a physical distance d or an electrical distance (for example, by changing the permittivity of a dielectric) between the pair of radio wave half mirrors 240A and 240B. The detailed structure thereof will be described below.

As such, since the resonator formed by the pair of plane-type radio wave half mirrors 240A and 240B is provided in the transmission line which transmits electromagnetic waves in the TE10 mode, a special technique for inputting plane waves is not needed and the radio wave half mirror can have an arbitrary shape which does not need to transmit the plane waves.

The filter is a substantially sealed type as a whole, loss due to radiation to an external space is small, and it is possible to achieve very high selectivity characteristics in the millimeter-wave band.

However, when the waveguide 221 is configured such that the size thereof is uniform over the entire length, the amount of attenuation of the stopband beyond the passband of the filter obtained by changing the resonance frequency is insufficient and it is difficult to sufficiently remove high-level unnecessary signals beyond the passband of the filter. In addition, as described above, when a plurality of pairs of radio wave half mirrors are provided and cascaded, the filters interfere with each other, which makes it difficult to obtain desired characteristics.

In order to solve the above-mentioned problems, in the millimeter-wave band filter 220 according to the embodiment, the high-pass filter 230 that is formed by a transmission line 223 which has a predetermined length (for example, 15 mm) and a size (for example, a size a'×b'=1.415 mm×0.708 mm) less than that of the first transmission line 222a such that a cutoff frequency is close to the lower limit of the passband of the filter in the stopband of the filter is provided in the first transmission line 222a provided between one end of the waveguide 221 and one radio wave half mirror 240A. Here, the cutoff wavelength of the transmission line with a size of 1.415 mm×0.708 mm in the TE10 mode is 1.415 mm×2=2.83 mm and corresponds to a frequency of about 106 GHz.

Two transmission lines 222a and 223 with different sizes are connected to each other through tapered portions 231 and 232 with a size which continuously changes in a predetermined length (for example, 5 mm) range and prevent unnecessary reflection.

In addition, a plurality of choke grooves 236 with a depth dp are formed around the inner wall of the high-pass filter 230. The plurality of choke grooves 236 form a band rejection filter 235 which attenuates a component in the stopband higher than the passband of the filter among the electromagnetic waves which pass through the transmission line 223 of the high-pass filter 230.

The choke groove 236 attenuates a component with a wavelength λg (=4d) which is determined by the depth dp. A plurality of choke grooves 236 are formed with different depths to obtain a wide stopband.

In FIG. 21, five choke grooves 236 are shown for convenience of illustration. However, in the embodiment, seven choke grooves 236 which have the same width of 0.2 mm and depths dp of 0.36 mm, 0.38 mm, 0.40 mm, 0.42 mm, 0.44 mm, 0.46 mm, 0.48 mm are provided at an interval of 0.35 mm (interval between the centers of the grooves) in the propagation direction.

When the depth dp is 0.48 mm, a cutoff wavelength is 1.92 mm and the frequency is about 156 GHz. When the depth dp is 0.36 mm, the cutoff wavelength is 1.44 mm and the frequency is about 208 GHz. Therefore, in the above-mentioned numerical example, it is possible to attenuate components in a band of 156 GHz to 208 GHz.

As such, since the band rejection filter 235 is provided which includes the high-pass filter 230 that has a cutoff frequency close to the upper limit frequency of the stopband lower than the passband of the filter and the plurality of choke grooves 236 that are provided in the inner wall of the high-pass filter 230 and attenuate components in the stopband higher than the passband of the filter, it is possible to significantly increase the amount of attenuation of the high stopband and the low stopband, without using the cascade connection structure of a plurality of pairs of radio wave half mirrors.

FIG. 23 shows the simulation results of frequency characteristics (S21) in each numerical example when only the high-pass filter 230 is provided in the waveguide 221. As can be seen from FIG. 23, when a frequency change width (filter pass band) is ±16 GHz of the resonance frequency (about 124 GHz) with a convex peak, the amount of attenuation of the stopband (about 108 GHz or less) that is equal to or lower than the frequency change width is equal to or less than −110 dB and it is possible to sufficiently attenuate a high-level unnecessary signal in the stopband (see the characteristics shown in FIGS. 5 and 6).

Figure 24:
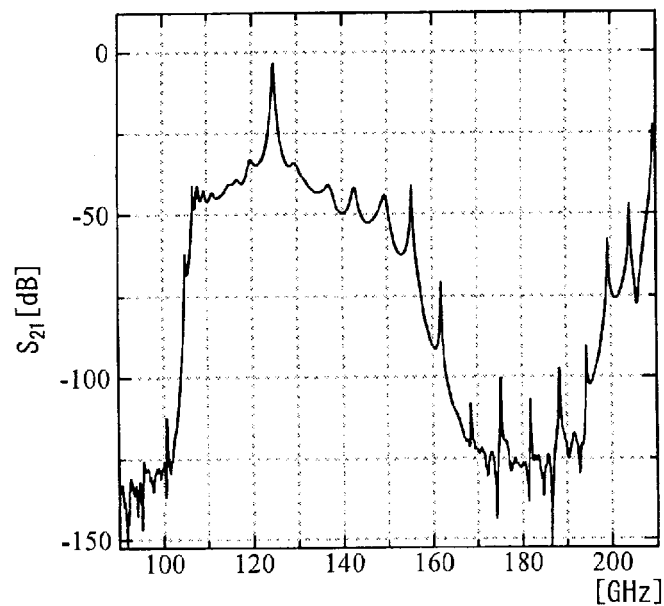
FIG. 24 is a diagram illustrating the simulation result of filter characteristics when the high-pass filter and the band rejection filter are provided.

FIG. 24 shows the simulation results of frequency characteristics (S21) in each numerical example when the high-pass filter 230 and the band rejection filter 235 are provided in the waveguide 221. As can be seen from FIG. 24, the high-pass filter 230 increases the amount of attenuation of the stopband (about 108 GHz or less) lower than the passband of the filter to −110 dB or less and increases the amount of attenuation of the stopband (about 162 GHz to 190 GHz) higher than the passband of the filter to −100 dB or less. Therefore, it is possible to sufficiently attenuate a high-level unnecessary signal in the stopband.

In the above-mentioned example, the high-pass filter 230 and the band rejection filter 235 are provided in the transmission line between one end of the waveguide 221 and the radio wave half mirror 240A. However, the high-pass filter 230 and the band rejection filter 235 may be provided between the other end of the waveguide 221 and the radio wave half mirror 240B or they may be provided on both sides of the pair of radio wave half mirrors 240A and 240B.

The band rejection filter 235 may be omitted in order to intensively increase the amount of attenuation of the low stopband.

Figure 25:
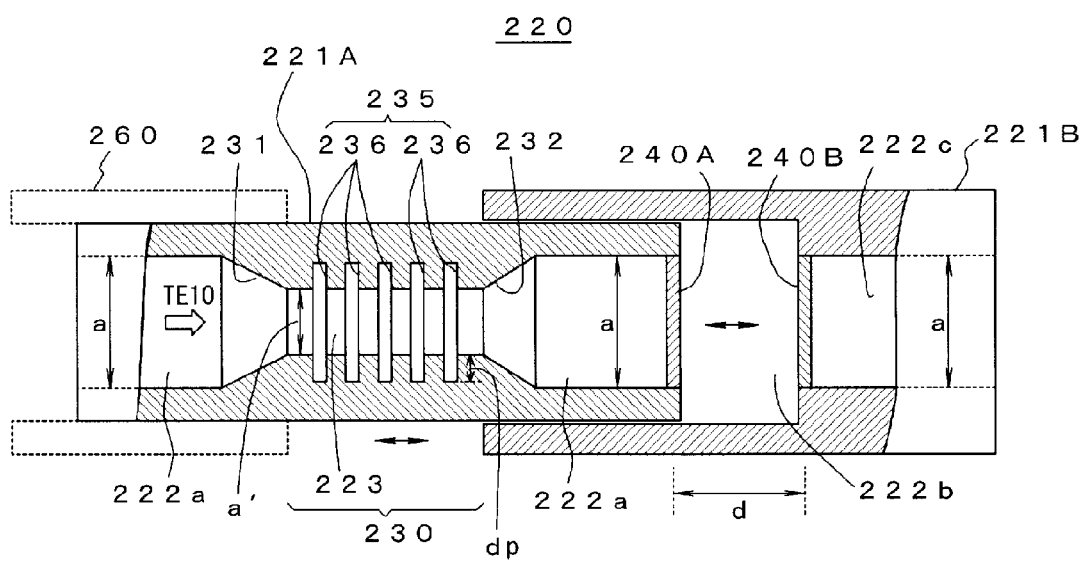
FIG. 25 is a diagram illustrating an example of a resonance frequency change mechanism.
Figure 26:
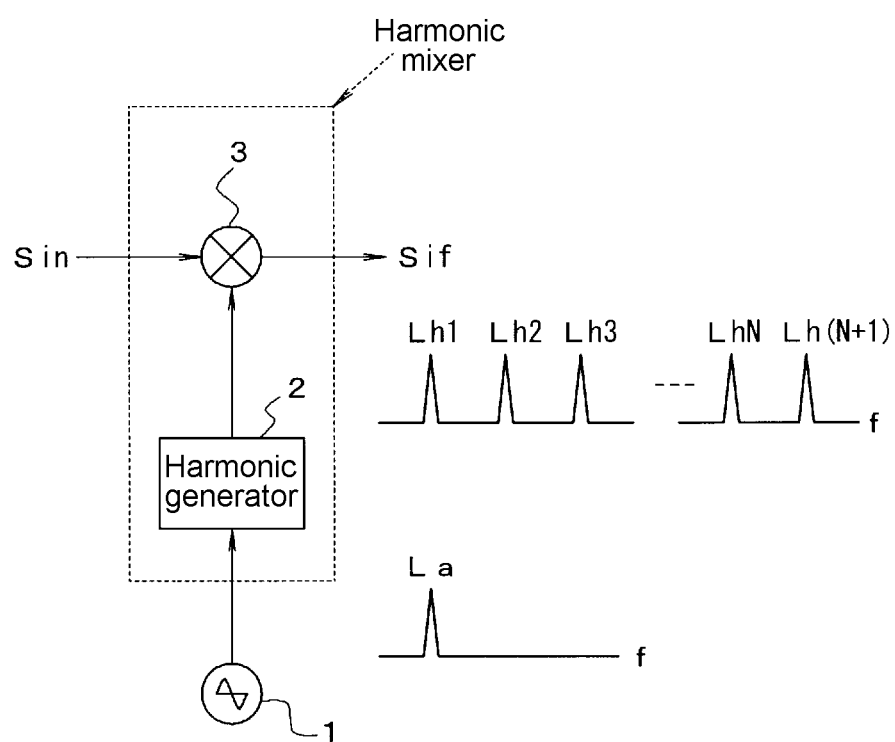
FIG. 26 is a circuit diagram illustrating a harmonic mixer.

Next, an example of a mechanism for changing the resonance frequency will be described. FIG. 25 shows an example of a structure which mechanically changes the distance d between the radio wave half mirrors 240A and 240B to change the resonance frequency. The waveguide 221 is formed by two waveguides 221A and 221B in which the transmission lines are continuous and which are slidably connected to each other, with one of the two waveguides 221A and 221B being inserted into the other waveguide. One radio wave half mirror 240A is fixed to the leading end of one waveguide 221A and the other radio wave half mirror 240B is fixed to an intermediate portion of the other waveguide 221B which has a different size from the waveguide 221A and receives the waveguide 221A from one end thereof.

In this structure, when one waveguide 221A slides relative to the other waveguide 221B, the distance d between the pair of radio wave half mirrors 240A and 240B is changed to change the resonance frequency (the driving device can use the above-mentioned structural example).

However, since one waveguide is moved in the direction in which electromagnetic waves are propagated, one of the circuits which are connected before and after the filter follows the filter. In order to solve this problem, a buffer portion (for example, a fixed waveguide denoted by reference numeral 260 in FIG. 25) for absorbing the movement of the waveguide needs to be provided between the waveguide and an external circuit. In this case, the length of the movable waveguide (in this example, the waveguide 221A) increases. However, when the high-pass filter 230 and the band rejection filter 235 are provided using the elongated portion, this structure is useful. The fixed waveguide 260 can be applied to each of the above-described embodiments.

An example of the structure of the millimeter-wave band filter used in the spectrum analysis device 20 has been described above. However, the structure is illustrative and various modifications of the structure can be made. For example, the groove 60 for preventing the leakage of electromagnetic waves or the air duct 70 may be provided in the millimeter-wave band filter 220 and the high-pass filter or the band rejection filter of the millimeter-wave band filter 220 may be provided in the millimeter-wave band filters 20 to 20".

DESCRIPTION OF REFERENCE NUMERALS AND SIGNS

10: MILLIMETER-WAVE BAND SPECTRUM ANALYSIS DEVICE
20, 20', 20": MILLIMETER-WAVE BAND FILTER
21, 23a, 24a, 25a, 26a, 27a: TRANSMISSION LINE
22 TO 27: WAVEGUIDE
30A, 30B: RADIO WAVE HALF MIRROR
40: DISTANCE CHANGE MEANS
51: DIELECTRIC
52: PERMITTIVITY CHANGE MEANS
60, 60': GROOVE
70, 70': AIR DUCT
100: FREQUENCY CONVERSION UNIT
110: SPECTRUM DETECTION UNIT
120: CONTROL UNIT
130: OPERATION UNIT
140: DISPLAY
220: MILLIMETER-WAVE BAND FILTER
221, 221A, 221B: WAVEGUIDE
222, 223: TRANSMISSION LINE
230: HIGH-PASS FILTER
235: BAND REJECTION FILTER
236: CHOKE GROOVE
240A, 240B: RADIO WAVE HALF MIRROR
250: RESONANCE FREQUENCY CHANGE MECHANISM
260: FIXED WAVEGUIDE

What is claimed is:

1. A millimeter-wave band spectrum analysis device comprising:
   a millimeter-wave band filter that includes a transmission line which is formed by a waveguide that propagates electromagnetic waves in a first millimeter-wave frequency band from one end to the other end in a single mode, a pair of planar radio wave half mirrors which are arranged so as to be opposite to each other with a distance therebetween while blocking the inside of the transmission line, transmit some of the electromagnetic waves in the first frequency band, and reflect some of the electromagnetic waves, and resonance frequency change means for changing an electrical length between the pair of radio wave half mirrors to change a resonance frequency of a resonator formed between the pair of radio wave half mirrors in the first frequency band, extracts a signal component in a band having the resonance frequency as a passband center frequency from a signal which is input from one end of the transmission line, and outputs the signal component from the other end;
   a frequency conversion unit that mixes the output signal from the millimeter-wave band filter with a first local signal with a fixed frequency to convert the output signal into a signal in a second frequency band lower than the first frequency band;
   a spectrum detection unit that converts each frequency component of the signal in the second frequency band which is converted by the frequency conversion unit into each frequency component in a predetermined intermediate frequency band using a second local signal whose frequency can be swept and detects the level of each frequency component; and
   a control unit that stores data which associates the resonance frequency with the electrical length between the pair of radio wave half mirrors of the millimeter-wave band filter in advance, changes the passband center frequency of the millimeter-wave band filter so as to cover an observation frequency range on the basis of the data when frequency resolution and a desired observation frequency range of the first frequency band are designated, controls the sweep of the frequency of the second local signal of the spectrum detection unit, and detects a spectrum waveform of a signal in the observation frequency range with the frequency resolution.

2. The millimeter-wave band spectrum analysis device according to claim 1,
   wherein the control unit has a first control mode which operatively associates a change in the passband center frequency of the millimeter-wave band filter with the sweep of the second local signal of the spectrum detection unit and a second control mode which sweeps the second local signal of the spectrum detection unit in a change step smaller than a change step of the passband center frequency of the millimeter-wave band filter and selects any one of the first control mode and second control mode on the basis of the designated observation frequency range and frequency resolution.

3. The millimeter-wave band spectrum analysis device according to claim 1,
   wherein the resonance frequency change means of the millimeter-wave band filter has a structure in which the distance between the pair of radio wave half mirrors is changed by a driving device having a stepping motor as a driving source, and
   the control unit uses a state in which the distance between the pair of radio wave half mirrors is equal to a predetermined value as a reference state and changes the passband center frequency of the millimeter-wave band filter on the basis of data which associates the resonance frequency with the number of driving pulses of the stepping motor.

4. The millimeter-wave band spectrum analysis device according to claim 2,
   wherein the resonance frequency change means of the millimeter-wave band filter has a structure in which the distance between the pair of radio wave half mirrors is changed by a driving device having a stepping motor as a driving source, and
   the control unit uses a state in which the distance between the pair of radio wave half mirrors is equal to a predetermined value as a reference state and changes the passband center frequency of the millimeter-wave band filter on the basis of data which associates the resonance frequency with the number of driving pulses of the stepping motor.

5. A millimeter-wave band spectrum analysis method comprising:
   a step of extracting a signal component in a band having a resonance frequency as a passband center frequency from a signal which is input from one end of a transmission line using a millimeter-wave band filter that includes the transmission line formed by a waveguide which propagates electromagnetic waves in a first millimeter-wave frequency band from one end to the other end in a single mode, a pair of planar radio wave half mirrors which are arranged so as to be opposite to each other with a distance therebetween while blocking the inside of the transmission line, transmit some of the electromagnetic waves in the first frequency band, and reflect some of the electromagnetic waves, and resonance frequency change means for changing an electrical length between the pair of radio wave half mirrors to change a resonance frequency of a resonator formed between the pair of radio wave half mirrors in the first frequency band;

a step of mixing the output signal from the millimeter-wave band filter with a first local signal with a fixed frequency to convert the output signal into a signal in a second frequency band lower than the first frequency band;

a step of converting each frequency component of the signal in the second frequency band which is converted by the step of converting frequency into each frequency component in a predetermined intermediate frequency band using a second local signal whose frequency can be swept and detecting the level of each frequency component; and a step of storing data which associates the resonance frequency with the electrical length between the pair of radio wave half mirrors of the millimeter-wave band filter in advance, changing the passband center frequency of the millimeter-wave band filter so as to cover an observation frequency range on the basis of the data when frequency resolution and a desired observation frequency range of the first frequency band are designated, controlling the sweep of the frequency of the second local signal, and detecting a spectrum waveform of a signal in the observation frequency range with the frequency resolution.

* * * * *